US012471232B2

(12) United States Patent
Lautenbach et al.

(10) Patent No.: US 12,471,232 B2
(45) Date of Patent: Nov. 11, 2025

(54) ELECTRICAL POWER UNIT WITH REPLACEABLE OUTER COVER

(71) Applicant: Norman R. Byrne, Ada, MI (US)

(72) Inventors: Aaron G. Lautenbach, Rockford, MI (US); William S. Otte, III, Rockford, MI (US); Roger J. Barr, Lowell, MI (US)

(73) Assignee: Norman R. Byrne, Ada, MI (US)

( * ) Notice: Subject to any disclaimer, the term of this patent is extended or adjusted under 35 U.S.C. 154(b) by 107 days.

(21) Appl. No.: 18/365,560

(22) Filed: Aug. 4, 2023

(65) Prior Publication Data

US 2024/0049403 A1 Feb. 8, 2024

Related U.S. Application Data

(60) Provisional application No. 63/370,391, filed on Aug. 4, 2022.

(51) Int. Cl.
H05K 5/10 (2025.01)
H05K 5/02 (2006.01)

(52) U.S. Cl.
CPC ............. H05K 5/10 (2025.01); H05K 5/0204 (2013.01)

(58) Field of Classification Search
None
See application file for complete search history.

(56) References Cited

U.S. PATENT DOCUMENTS

| 3,005,179 | A | 10/1961 | Holt |
| 3,315,219 | A | 4/1967 | Brinser et al. |
| 3,349,363 | A | 10/1967 | Goodman |
| 4,193,660 | A | 3/1980 | Jaconette |
| 4,934,962 | A | 6/1990 | Luu et al. |
| 5,129,842 | A | 7/1992 | Morgan et al. |
| 5,503,565 | A | 4/1996 | McCoy |
| 5,556,308 | A | 9/1996 | Brown et al. |
| 6,220,880 | B1 * | 4/2001 | Lee ...................... H01R 25/003 |
| | | | 439/535 |
| D472,213 | S | 3/2003 | Byrne |
| 6,547,588 | B1 * | 4/2003 | Hsu ...................... H01R 13/518 |
| | | | 439/535 |
| 6,581,834 | B2 | 6/2003 | Chien |
| 6,617,511 | B2 | 9/2003 | Schultz et al. |
| 6,782,617 | B2 | 8/2004 | Pulizzi |

(Continued)

FOREIGN PATENT DOCUMENTS

| GB | 2240669 | 7/1991 |
| GB | 2119703 | 7/1998 |
| JP | 2009247161 | 10/2009 |

*Primary Examiner* — Xanthia C Relford
*Assistant Examiner* — Xanthia C Cunningham
(74) *Attorney, Agent, or Firm* — Gardner, Linn, Burkhart & Ondersma LLP

(57) ABSTRACT

An electrical power unit includes housing portions that are assembled together and then surrounded by a cover extending around their top, bottom, and sides. At least one of the housing portions includes elongate element, such as a ridge or channel, which aligns with an elongate guide element, such as a channel or ridge, which is defined by the outer cover. Front and rear face panels enclose or cover front and rear openings defined by the housing portions, with one or both face panels providing support and/or access to electrical outlets or contacts inside the housing portions.

20 Claims, 14 Drawing Sheets

(56) References Cited

U.S. PATENT DOCUMENTS

| | | |
|---|---|---|
| 6,824,422 B2 | 11/2004 | Huang |
| 6,830,477 B2 | 12/2004 | Vander Vorste et al. |
| 6,908,324 B1 | 6/2005 | Morely et al. |
| 6,910,913 B1 | 6/2005 | Satern |
| 6,929,514 B1 | 8/2005 | Chuang |
| 6,932,624 B1 | 8/2005 | Hoopes et al. |
| 6,979,205 B2 | 12/2005 | Hoopes et al. |
| 7,094,077 B1 | 8/2006 | Chen |
| D535,257 S | 1/2007 | Byrne |
| D537,785 S | 3/2007 | Pincek |
| 7,201,589 B2 | 4/2007 | Jong |
| 7,275,947 B2 | 10/2007 | Hartel et al. |
| 7,347,744 B2 | 3/2008 | Tabata et al. |
| 7,438,566 B2 | 10/2008 | Chen |
| D583,762 S | 12/2008 | Gershfeld |
| D585,379 S | 1/2009 | Gershfeld |
| 7,488,204 B2 | 2/2009 | Hsu |
| 7,544,071 B2 | 6/2009 | Jong |
| 7,557,309 B2 | 7/2009 | Ross et al. |
| 7,559,795 B2 | 7/2009 | Byrne |
| 7,661,966 B2 | 2/2010 | Ohanesian |
| D626,069 S | 10/2010 | Byrne |
| D626,070 S | 10/2010 | Byrne |
| 7,833,027 B2 | 11/2010 | Jong |
| D639,244 S | 6/2011 | Byrne |
| 8,002,586 B2 | 8/2011 | Fleisig |
| 8,002,587 B2 | 8/2011 | Fleisig |
| 8,016,611 B2 | 9/2011 | Fleisig |
| 8,026,633 B2 | 9/2011 | Flesig et al. |
| 8,033,867 B1 | 10/2011 | Kessler et al. |
| 8,043,116 B2 | 10/2011 | Liao |
| D649,514 S | 11/2011 | Byrne |
| 8,158,883 B2 | 4/2012 | Soffer |
| 8,159,085 B2 | 4/2012 | Fleisig |
| D660,237 S | 5/2012 | Byrne |
| 8,172,604 B2 | 5/2012 | Byrne |
| 8,174,147 B2 | 5/2012 | Fleisig |
| 8,193,658 B2 | 6/2012 | Fleisig |
| 8,207,627 B2 | 6/2012 | Aldag et al. |
| 8,217,528 B2 | 7/2012 | Fleisig |
| 8,221,158 B2 | 7/2012 | Liao |
| D665,355 S | 8/2012 | Byrne |
| D666,556 S | 9/2012 | Byrne |
| 8,295,036 B2 | 10/2012 | Byrne |
| 8,444,432 B2 | 5/2013 | Byrne et al. |
| 8,480,429 B2 | 7/2013 | Byrne |
| 8,736,106 B2 | 5/2014 | Byrne et al. |
| 8,758,031 B2 | 6/2014 | Cheng et al. |
| 8,951,054 B2 | 2/2015 | Byrne |
| 9,312,673 B2 | 4/2016 | Byrne et al. |
| 10,008,816 B2 | 6/2018 | Byrne et al. |
| 10,673,191 B2 | 6/2020 | Byrne et al. |
| 10,720,795 B2 | 7/2020 | Byrne et al. |
| 10,873,167 B2 | 12/2020 | Byrne et al. |
| 10,965,049 B2 | 3/2021 | Byrne et al. |
| 11,251,562 B2 * | 2/2022 | Byrne ............... H01R 31/02 |
| 11,424,561 B2 | 8/2022 | Byrne et al. |
| 11,923,645 B2 * | 3/2024 | Bordewyk ......... H01R 25/003 |
| 2002/0154528 A1 | 10/2002 | Ravid |
| 2003/0117104 A1 | 6/2003 | Liao |
| 2003/0176100 A1 | 9/2003 | Yurek et al. |
| 2007/0173082 A1 * | 7/2007 | Chiao ............... H01R 31/06 |
| | | 439/76.1 |
| 2008/0200050 A1 | 8/2008 | Byrne |
| 2010/0090531 A1 | 4/2010 | Mahaffey |
| 2010/0317233 A1 | 12/2010 | Byrne |
| 2011/0003505 A1 | 1/2011 | Greig et al. |
| 2011/0076880 A1 | 3/2011 | Fleisig |
| 2011/0084660 A1 | 4/2011 | McSweyn |
| 2011/0104945 A1 | 5/2011 | Gao et al. |
| 2012/0009820 A1 | 1/2012 | Byrne |
| 2012/0091798 A1 | 4/2012 | Fleisig |
| 2012/0258628 A1 * | 10/2012 | Huang ............. B60R 16/0232 |
| | | 439/620.21 |
| 2013/0051080 A1 | 2/2013 | Van Der Linde et al. |
| 2013/0280956 A1 | 10/2013 | Cheng et al. |
| 2014/0213093 A1 | 7/2014 | Tal et al. |
| 2016/0141973 A1 | 5/2016 | Abdalla et al. |
| 2019/0341712 A1 * | 11/2019 | Byrne ............... H02G 3/086 |

* cited by examiner

ELECTRICAL POWER UNIT WITH REPLACEABLE OUTER COVER

CROSS REFERENCE TO RELATED APPLICATION

The present invention claims the benefit of U.S. provisional application Ser. No. 63/370,391, filed Aug. 4, 2022, which is hereby incorporated herein by reference in its entirety.

FIELD OF THE INVENTION

The present invention relates to electrical power and/or data outlet or receptacle systems for use in work areas and the like.

BACKGROUND

The need or desire to incorporate electrical power outlets in different locations has increased as portable electronic devices such as mobile phones, portable media players, laptop computers, and the like have proliferated, since these devices often require charging of onboard batteries. Such devices or their charging cords often require access to high voltage (e.g., 110V AC or 220V AC) power outlets and/or low voltage (e.g., 5-12V DC) power outlets, which are typically assembled into housings for mounting at a desired location.

SUMMARY OF THE INVENTION

The present invention provides an electrical power unit that includes an outer cover to improve and facilitate changes to the aesthetic appearance of the electrical power unit. The outer cover obscures housing surfaces and may hide fasteners or other structures of the power unit. The design of the electrical power unit allows users to easily install, remove, and/or replace the outer cover as desired. The power unit may include high voltage AC power receptacles and one or more low voltage DC power receptacles, or even electronic data receptacles.

In one form of the present invention, an electrical power unit includes a first housing portion coupled to a second housing portion, the second housing portion including an outer elongate guide element. Inner and outer front face panels are coupled at a front opening defined by the first and second housing portions, and a second face panel is coupled at a rear opening defined by first and second housing portions. An outer cover includes an inner elongate guide element that aligns with the outer guide element of the second housing portion.

According to one aspect, the outer elongate guide element is a rib and the inner elongate element is a channel.

According to another aspect, the electrical power unit includes a receptacle including a receptacle housing that defines a first receptacle opening, the second face panel defines a second receptacle opening, the first and second openings configured for insertion of a plug or prong into the receptacle.

According to yet another aspect, the inner first face panel defines a recess for receiving an inwardly-extending protrusion corresponding to the outer elongate guide element of the second housing portion.

According to still another aspect, the first elongate guide element is a rib, the second and third elongate elements are channels.

According to a further aspect, the rib inserts into the channels.

According to yet another aspect, the outer cover is made of at least one of resinous plastic, metal, rubber, cork, fabric, and wood.

According to yet another aspect, the first and second housing portions include ribs to support the outer cover.

According to another aspect, the second housing portion includes an electrical contact support.

According to still another aspect, the first housing portion is a lower housing, the second housing portion is an upper housing, the inner and outer first face panels are inner and outer front face panels, and the second face panel is a rear face panel.

Thus, the electrical power unit of the present invention is configurable to support and provide users with access to different types of electrical power and/or electronic data receptacles, while also facilitating customization or changing of the outer appearance of the unit according to preference. Elongate guides assist with proper alignment of the outer cover with the housing portions, and also resist inadvertent removal or undesired movement of the outer cover.

These and other objects, advantages, purposes and features of the invention will become apparent upon review of the following specification in conjunction with the drawings.

DESCRIPTION OF THE PREFERRED EMBODIMENTS

Figure 1:
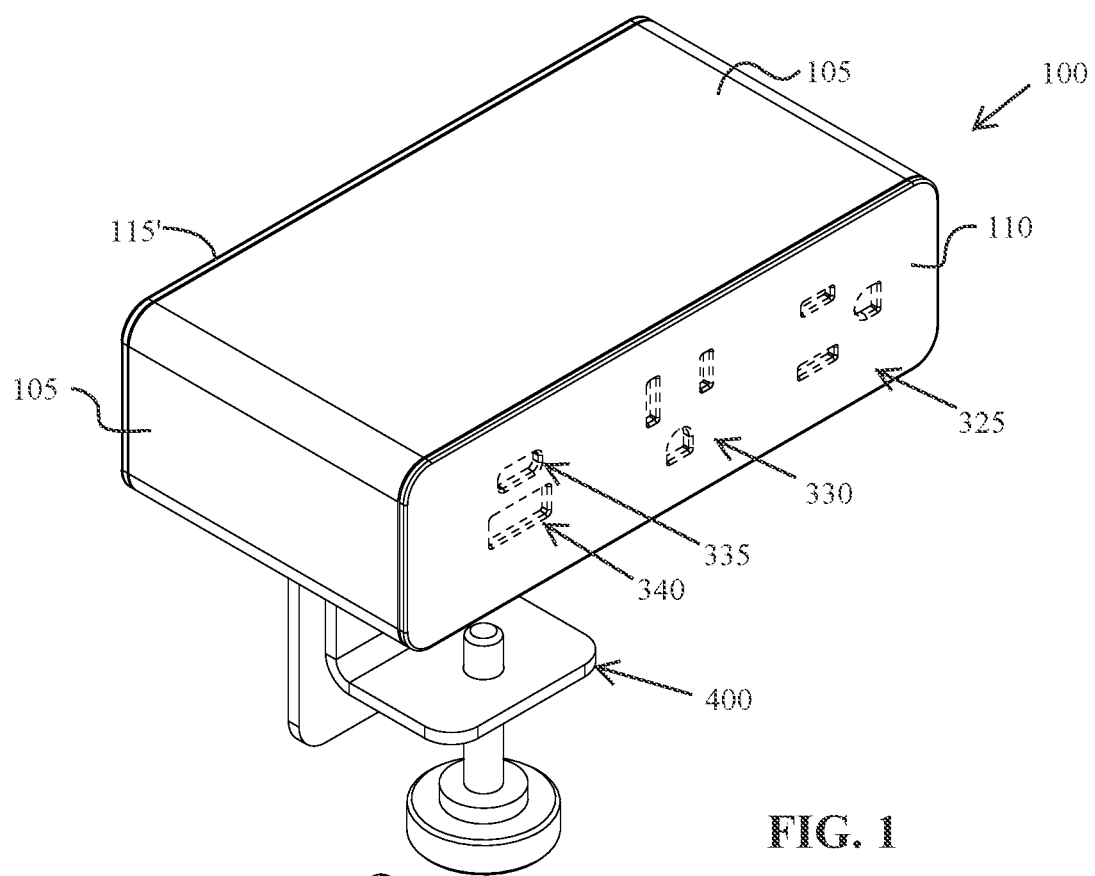
FIG. 1 is a front, top perspective view of an electrical power unit in accordance with the present invention.

Referring now to the drawings and illustrative embodiments depicted herein, an electrical power unit 100, includes an outer cover 105 surrounding a lower housing portion 120 and an upper housing portion 125 that cooperate to define front and rear openings, such as shown in FIGS. 1-4. An outer front face panel 110 and inner front face panel 130 substantially cover or close the front opening that is defined by housing portions 120, 125, and similarly a rear face panel 115 substantially covers or closes the rear opening that is defined by the housing portions 120, 125. This arrangement allows for the aesthetic appearance of the electrical power unit 100 to be changed as desired using different outer covers, and improved by covering exposed retaining elements, such as fasteners that secure the lower housing portion 120 to the upper housing portion 125, and fasteners that secure the outer front face panel 110 to the lower and upper housing portions 120, 125. The electrical power unit 100 allows users to easily insert, remove, and/or replace the outer cover 105 as desired such as, for example, to swap damaged or deteriorated outer cover for a new outer cover, or to change to an outer cover having a different color, material, or other appearance aspect. The inner and outer front face panels 130, 110 and the rear face panel 115 may also be changed to accommodate different types, locations, and orientations of receptacles or input cords, or to change the aesthetic appearance of the rear face panel 115 and outer front face panel 110, as will be described below. The outer front face panel 110 may serve as a purely aesthetic piece that completely covers the inner front face panel 130 and the front edges of the housing portions 120, 125 so that, when outer cover 105 and rear face panel 115 are also installed, housing portions 120, 125 are substantially or entirely obscured from view. Outer front face panel 110 may be installed and removed without need for tools, allowing the outer cover 105 to also be slipped off and replaced without tools, followed by reinstallation of the outer front face panel 110 to retain the outer cover 105 in place.

Throughout the description and claims presented herein, it will be appreciated that directional references such as "forward", "rearward", "upper", and "lower" are used merely for convenience to facilitate understanding and describe relative positioning of various components, and are not intended to be limiting as it should be appreciated that the electrical power or electronic data unit may be used in substantially any desired orientation. It should be further appreciated that electrical power contacts, receptacles, and plugs, as described herein, may be readily substituted with electronic data contacts, receptacles, and plugs, without departing from the spirit and scope of the present invention.

Figure 2:
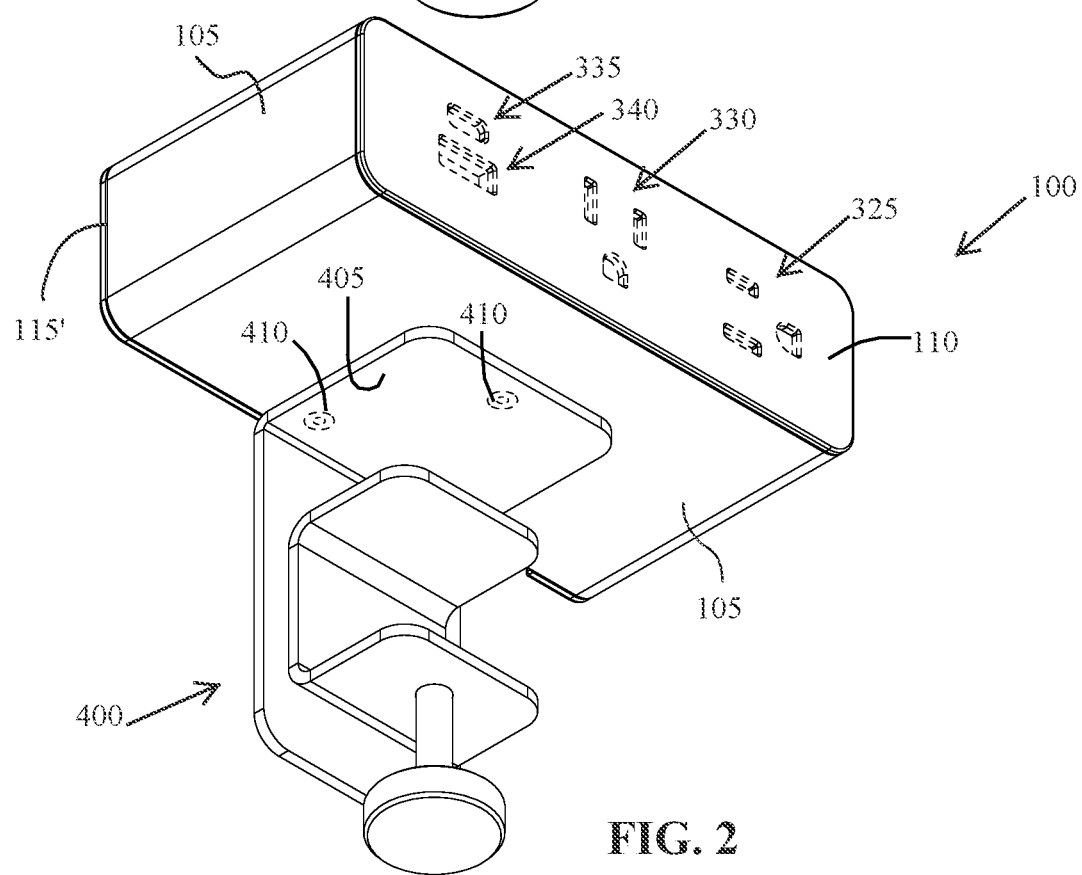
FIG. 2 is a front, bottom perspective view of the electrical power unit of FIG. 1.
Figure 3:
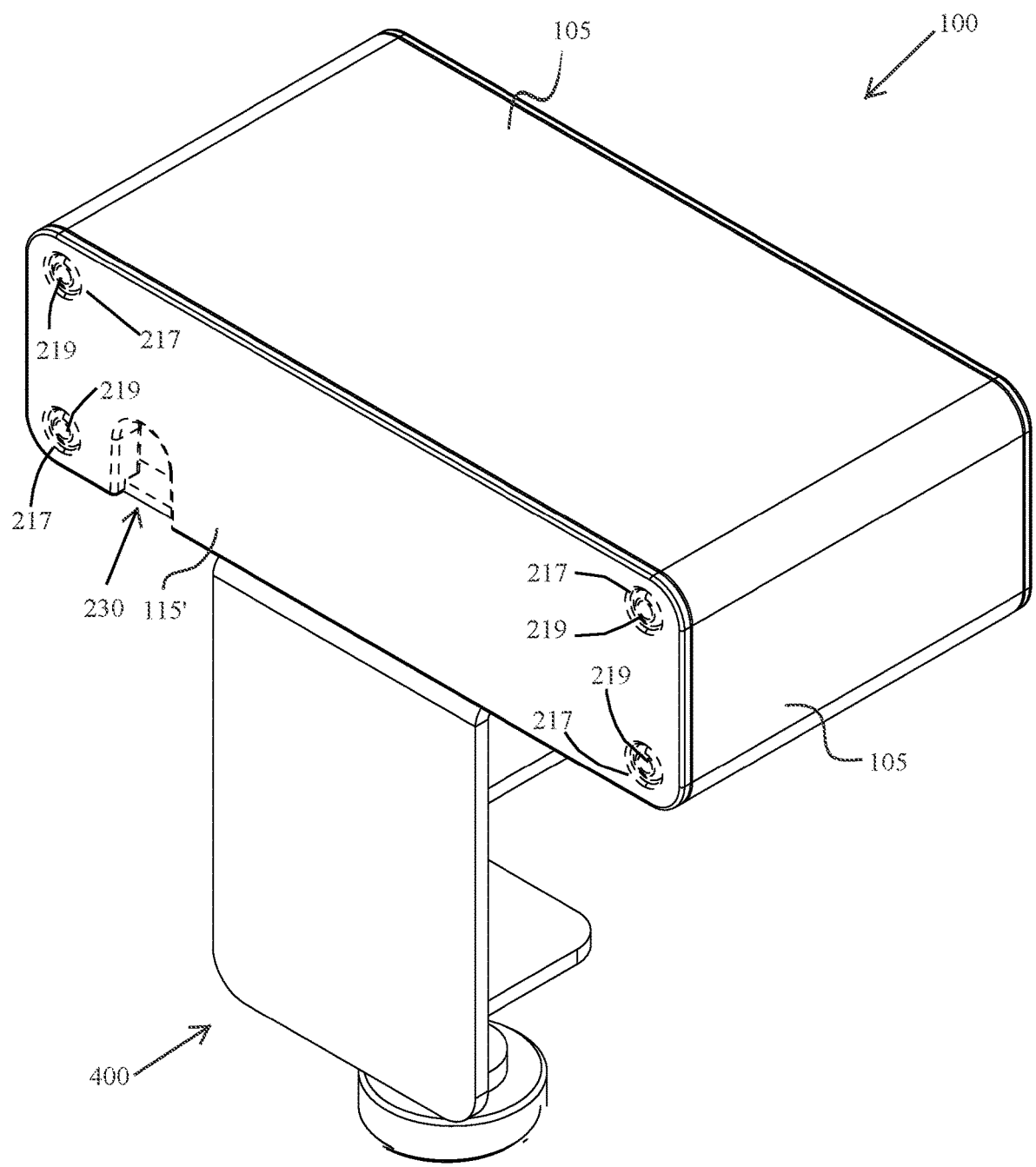
FIG. 3 is a rear, top perspective view of the electrical power unit of FIG. 1.
Figure 4:
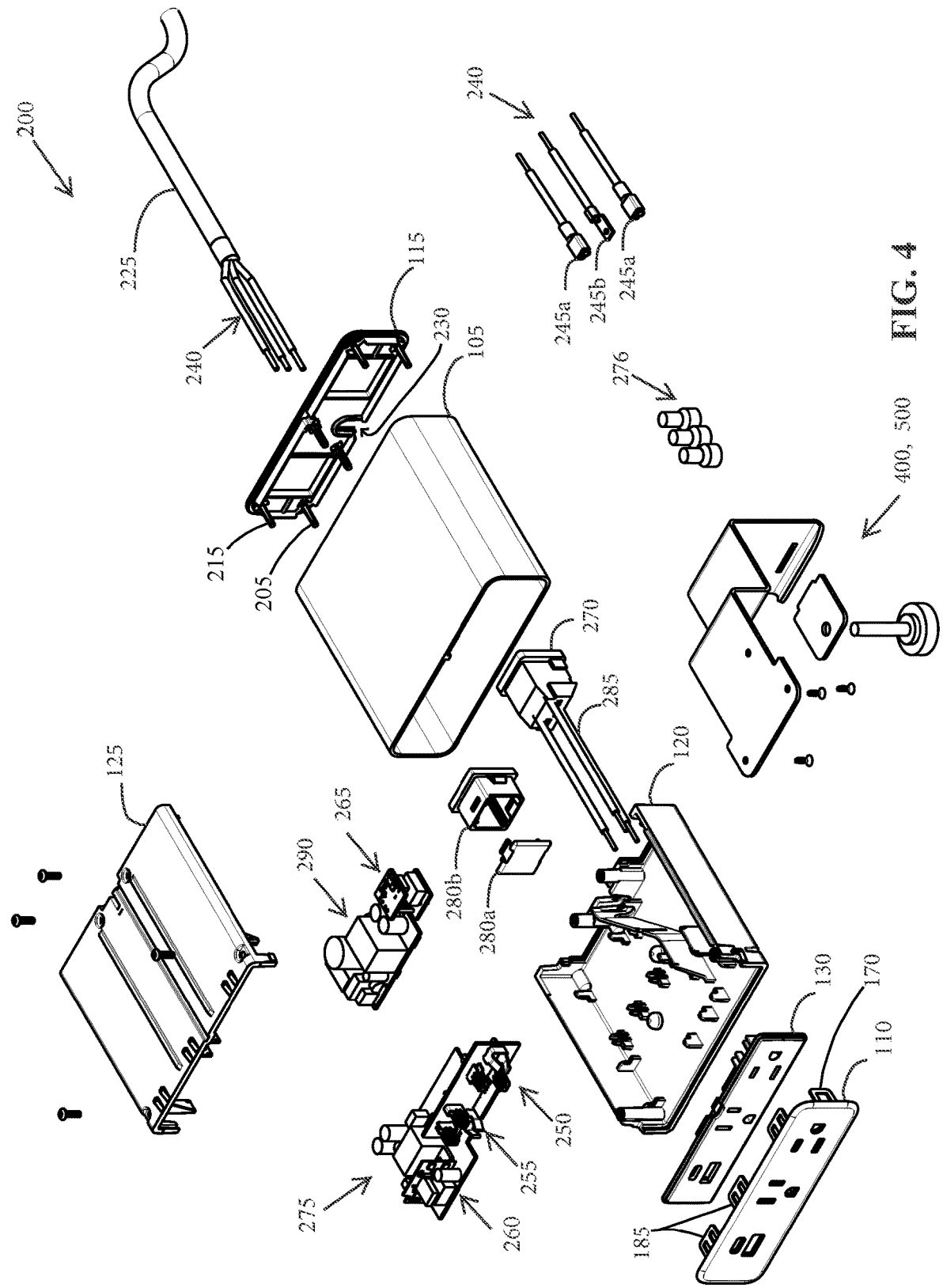
FIG. 4 is an exploded front, top perspective view of another electrical power unit in accordance with the present invention and similar to that of FIG. 1.
Figure 5:
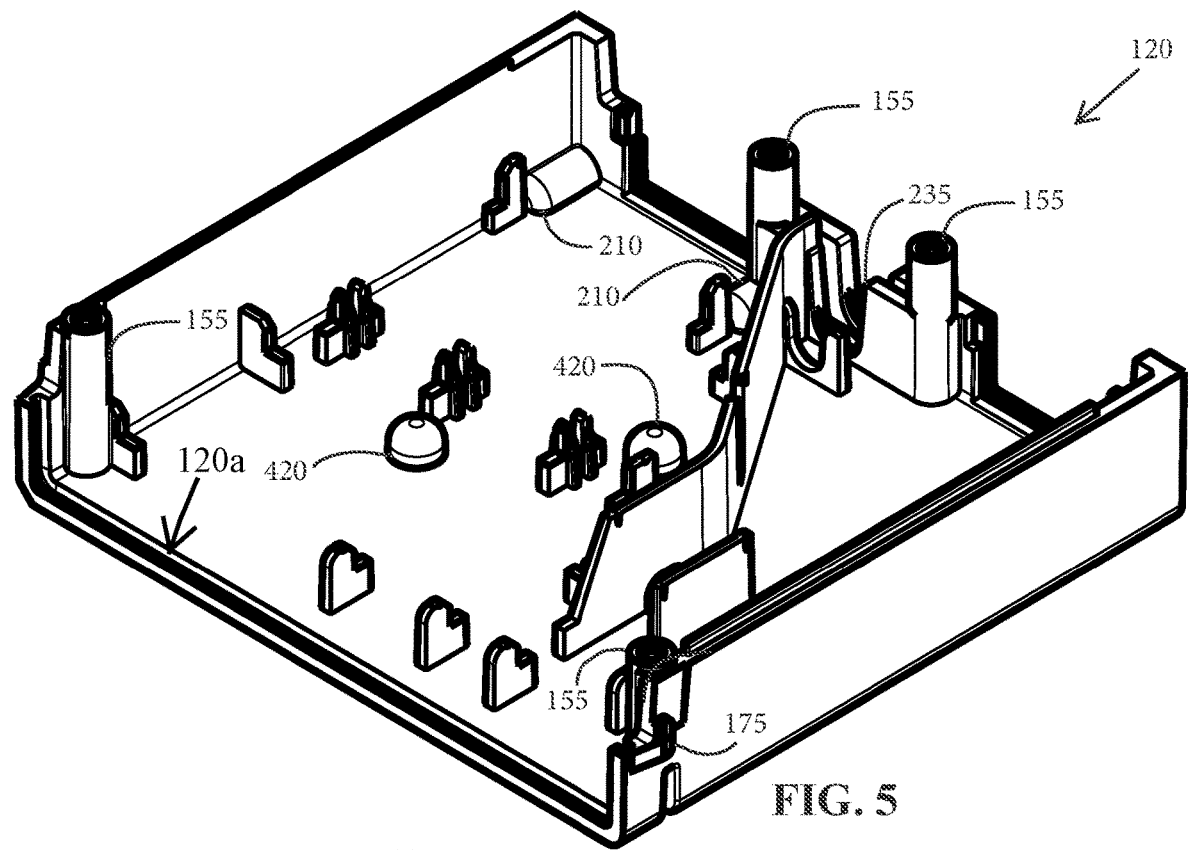
FIG. 5 is a front, top perspective view of a lower housing portion of the electrical power unit of FIG. 4.
Figure 6:
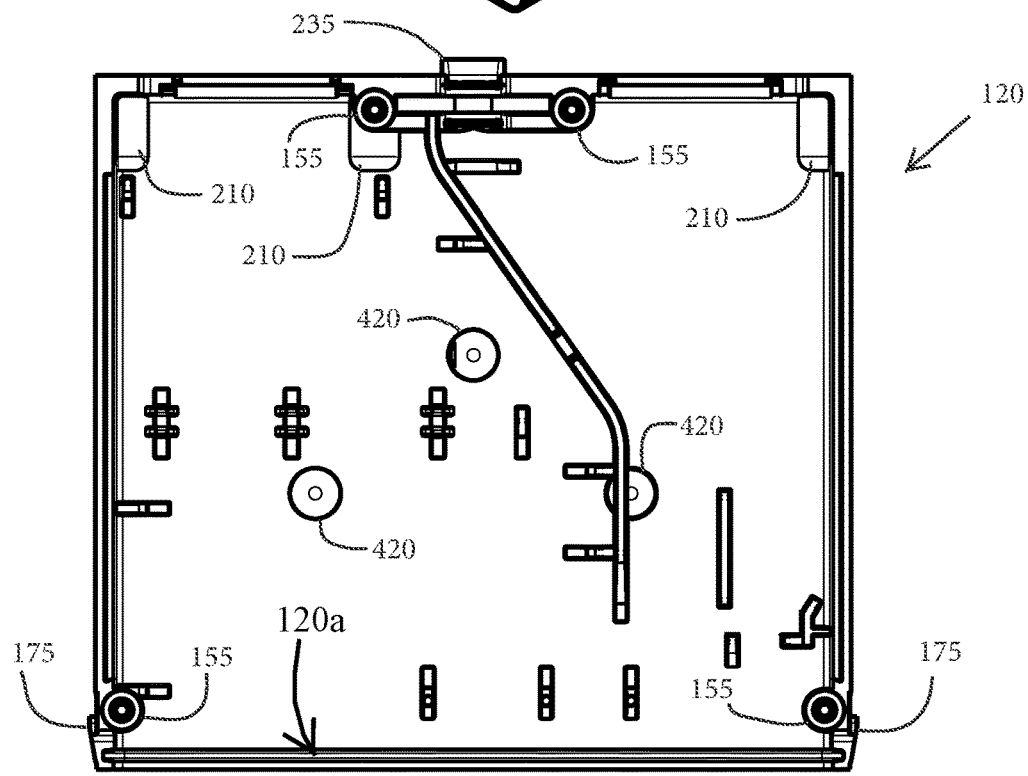
FIG. 6 is a top plan view of the lower housing portion of the electrical power unit of FIG. 4.

It should be appreciated that the electrical power unit 100 of FIGS. 1-3 is similar to the electrical power unit 200 of FIG. 4, but the electrical power unit 100 is a simpler design having a shallower depth and electrical outlets only in the front, whereas electrical power unit 200 has a greater depth and accommodates electrical outlets at both the front and rear regions, as will be described in more detail below. Referring to FIG. 4, the electrical power unit 200 is assembled by securing the lower housing portion 120 to the upper housing portion 125, with an assortment of desired electrical or electronic receptacles and circuitry supported inside, as will be described below. The lower and upper housing portions 120, 125 define respective front channels 120a, 125a (FIGS. 4-9) that cooperate to receive a perimeter edge or outer periphery 130a of the inner front face panel 130. In this way, inner front face panel 130 is secured in place at the front opening of housing portions 120, 125 when the housing portions are fitted together, and inner front face panel 130 cannot be removed until the housing portions 120, 125 are at least partially separated. Outer cover 105 is sleeved over the inner front face panel 130 and the lower and upper housing portions 120, 125 until reaching the rear face panel 115, to finish assembling the electrical power unit 200, such as in the manner shown for power unit 100 of FIGS. 1-3.

Outer front face panel 110 and rear face panel 115 may be installed after the housing portions 120, 125 are assembled together, and may also be installed after the outer cover 105 is installed. Outer front face panel 110 may have a height and width that are larger than the height and width of the assembled housing portions 120, 125, and approximately equal to the height and width of the outer cover 105. In this way, outer front face panel 110 covers or obscures a forward edge of the outer cover 105, and outer front face panel 110 would typically be removed prior to removing outer cover 105 over the forward ends of the housing portions 120, 125. Rear face panel 115 may be sized similarly to the outer front face panel 110, including an outer periphery with width and height that are somewhat greater than the width and height of the assembled housing portions 120, 125, and that may be roughly the same as the overall width and height of the outer cover 105 when it is installed. In this way, the outer cover 105 can be captured between the outer peripheries of the outer front face panel 110 and the rear face panel 115.

Figure 13:
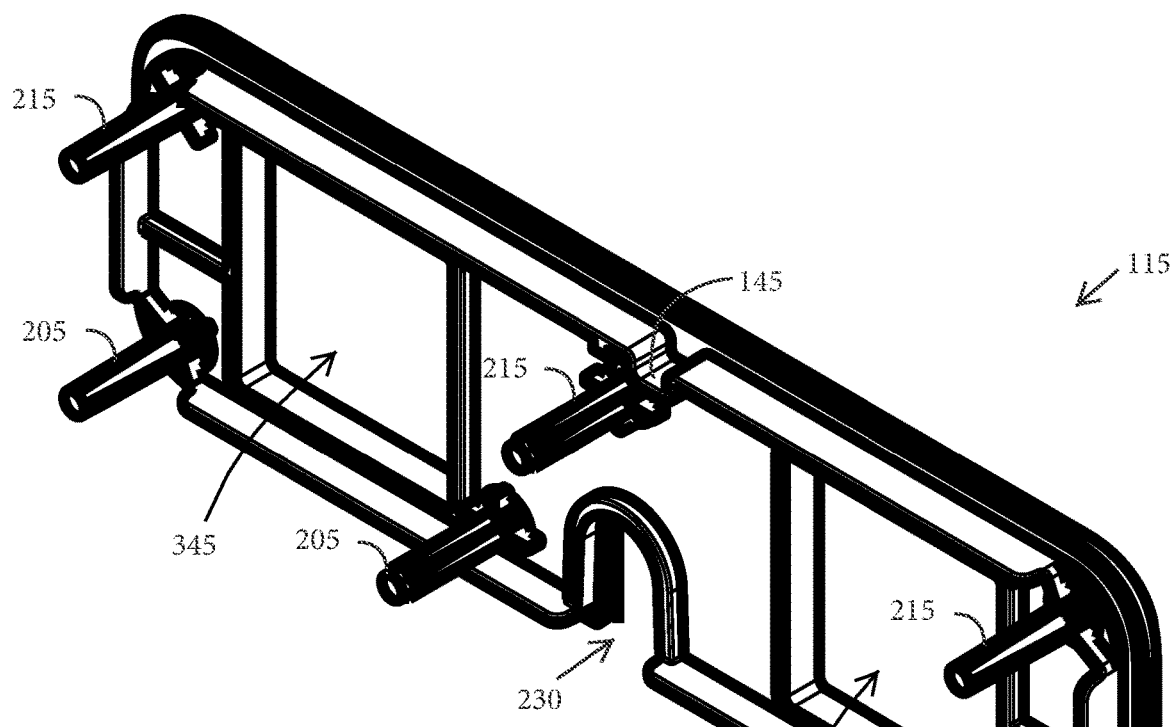
FIG. 13 is a front, top perspective view of a rear face panel of the electrical power unit of FIG. 4.
Figure 14:
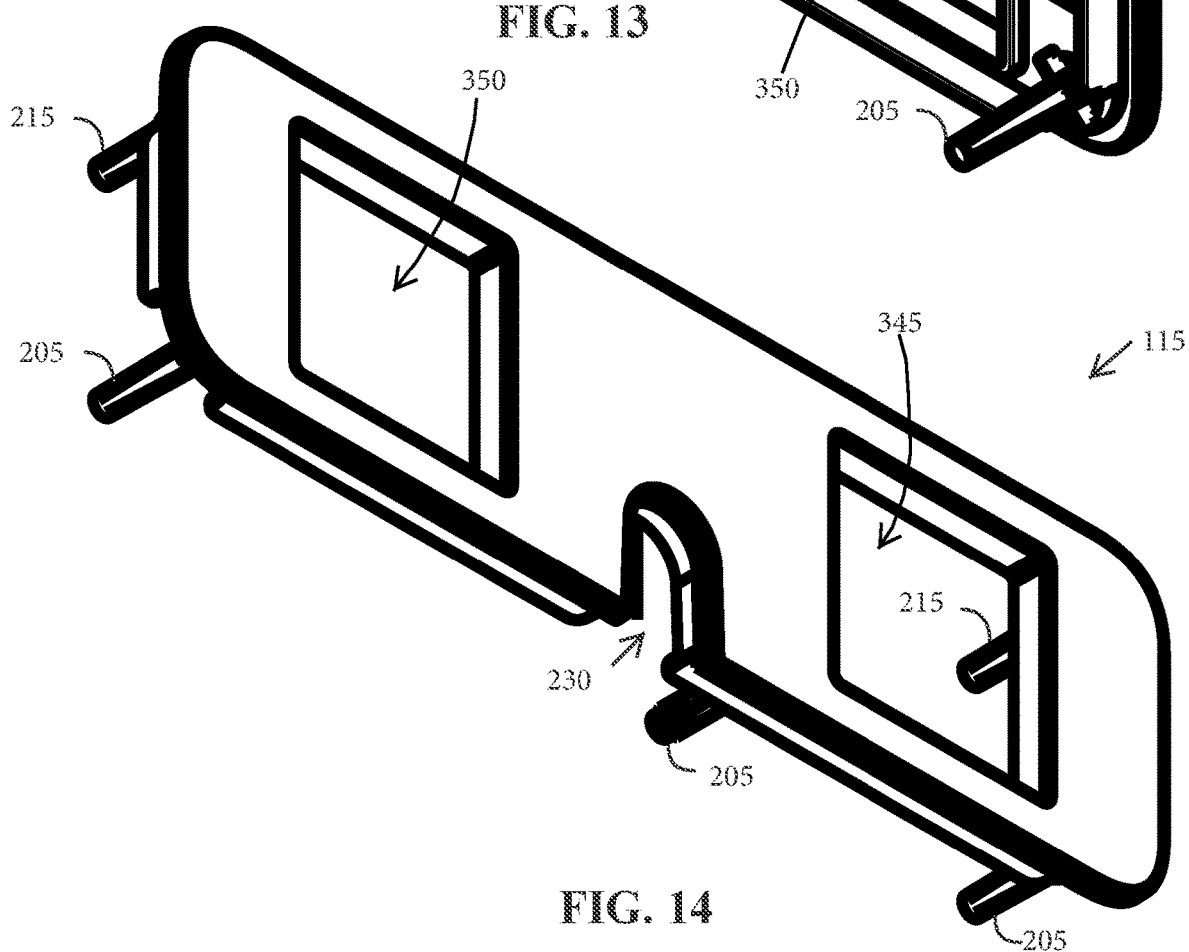
FIG. 14 is a rear, bottom perspective view of the rear face panel of the electrical power unit of FIG. 4.
Figure 15:
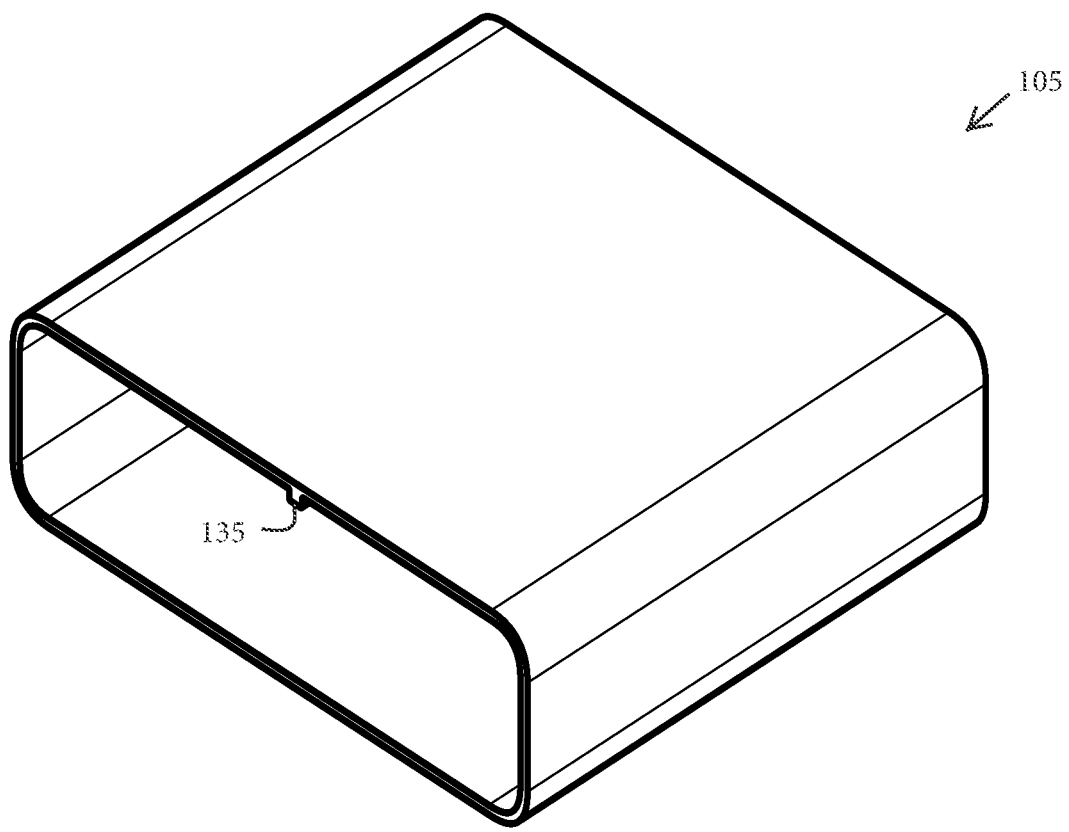
FIG. 15 is a front, top perspective view of an outer cover of the electrical power unit of FIG. 4.
Figure 16:
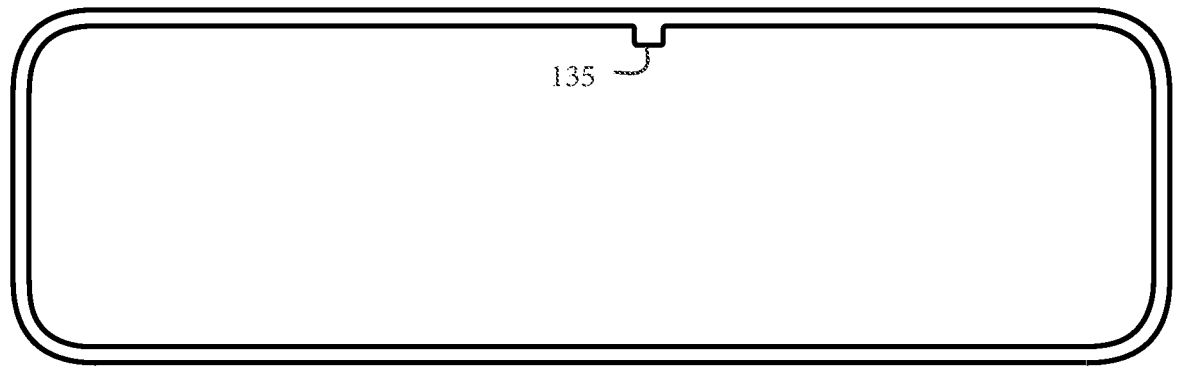
FIG. 16 is a front perspective view of the outer cover of the electrical power unit of FIG. 4.
Figure 23:
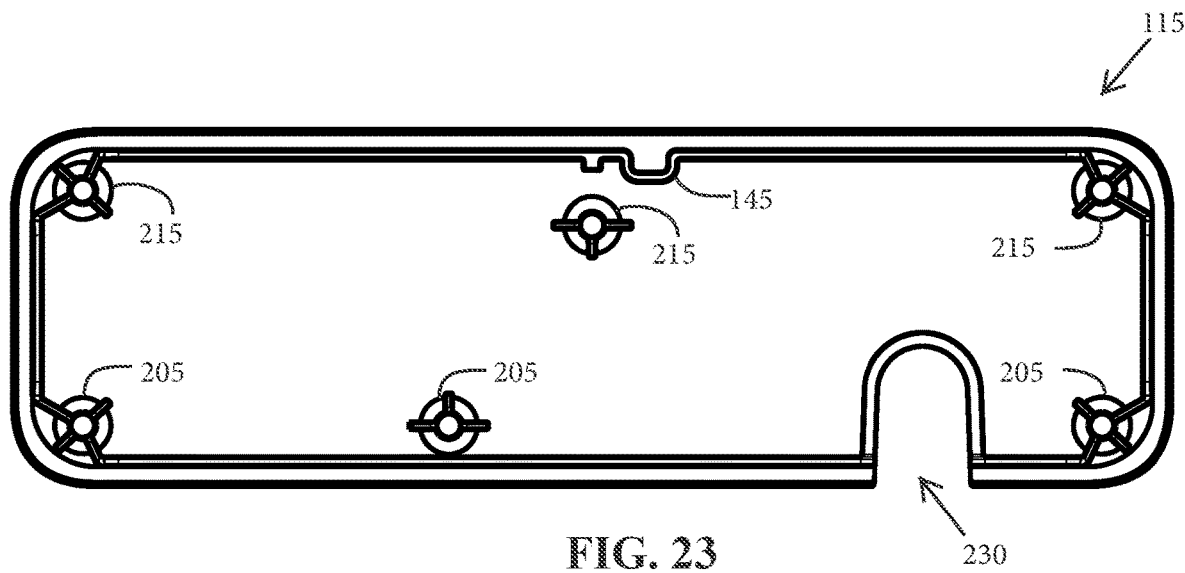
FIG. 23 is a front elevation view of the rear face panel of FIG. 22.

Referring to FIGS. 15 and 16, the outer cover 105 includes an elongate guide element in the form of a rib 135 that aligns with a corresponding elongate guide element in the form of a recessed channel 140 defined along an upper surface of the upper housing 125 (FIGS. 8, 9, 20, and 21) and a channel or recess 145 formed in an upper-inner portion of the rear face panel 115 (FIGS. 13, 14, and 23). The rib 135 is received into the channels 140, 145 by aligning the rib 135 and sliding or pushing the outer cover 105 over the assembled inner front face panel 130 and housing portions 120, 125, up to the rear face panel 115 (FIG. 4). Outer front face panel 110 may then be pushed into place, although it will be appreciated that when outer cover 105 is made from soft or flexible materials, it may be possible to slide the cover 105 with rib 135 over the outer front face panel 110 when the outer panel 110 is already assembled to the inner front face panel 130 and housing portions 120, 125. It is envisioned that other types of guide elements may be used to align and guide the outer cover 105 over the assembled configuration of the lower and upper housings 120, 125, the inner and outer front face panels 130, 110, and the rear face panel 115.

Figure 10:
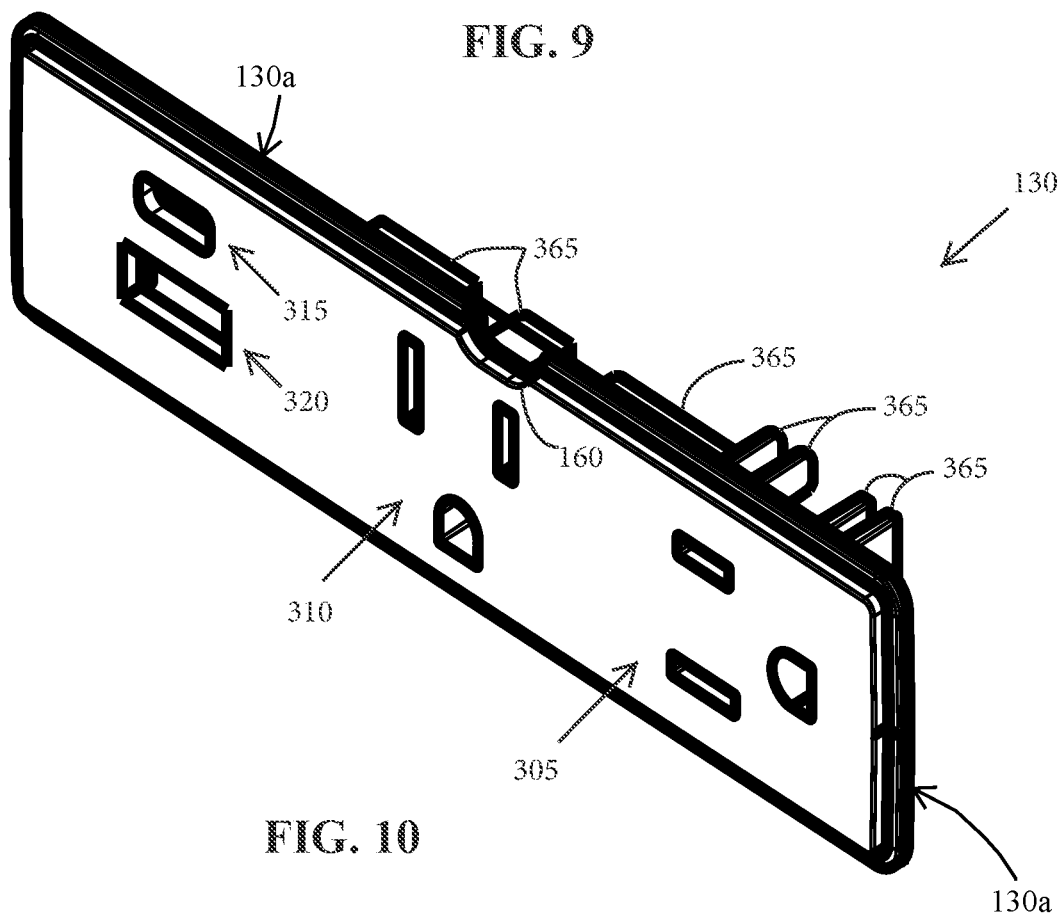
FIG. 10 is a front, top perspective view of an inner front face panel of the electrical power unit of FIG. 4.
Figure 11:
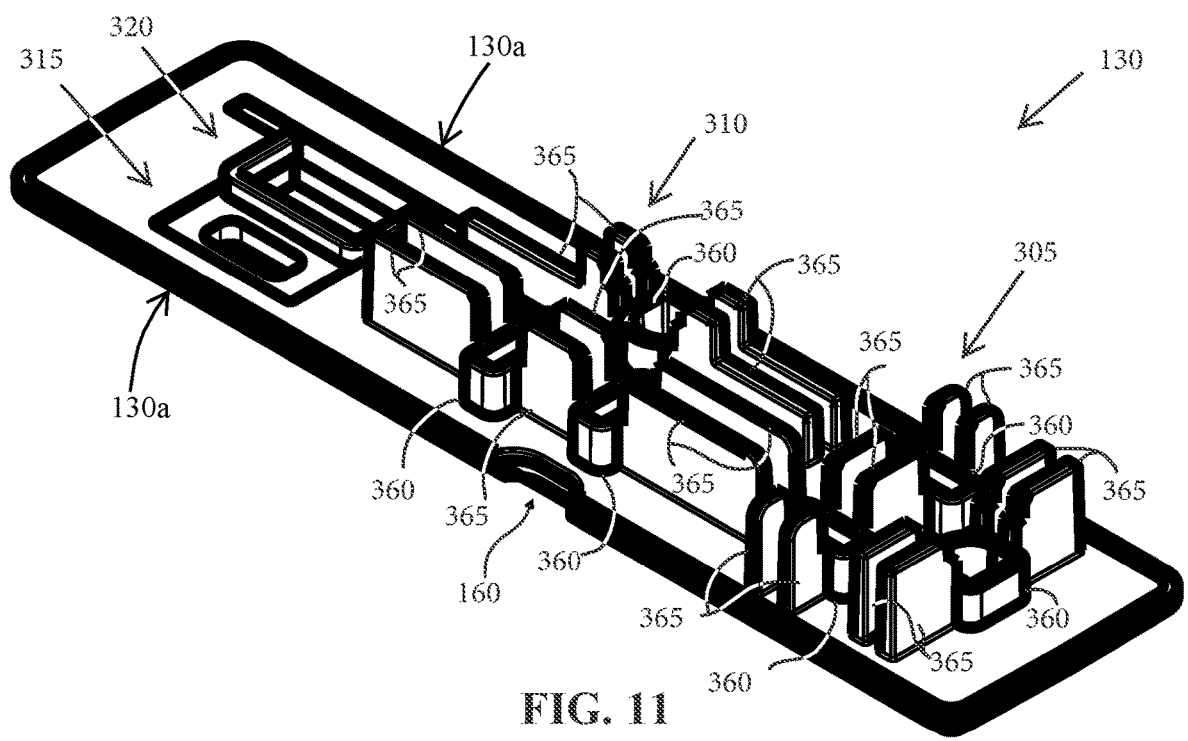
FIG. 11 is a rear, top perspective view of the inner front face panel of the electrical power unit of FIG. 4.

Once electrical components and inner front face panel 130 are initially mounted into the lower housing portions 120, the lower and upper housing portions 120, 125 are secured together by inserting threaded fasteners (not shown) through openings 150 defined in the upper housing portion 125 (FIGS. 8, 9, 20, and 21) and into respective threadable bosses 155 (FIGS. 5-7, 18, and 19) that are formed in the lower housing portion 120. The inner front face panel 130 defines a recess 160 (FIGS. 10 and 11) that aligns with and receives a downwardly-extending protrusion 165 (FIGS. 8 and 20) that is associated with the channel 140 formed in the upper housing portion 125, as can be envisioned with reference to FIG. 4.

Figure 12:
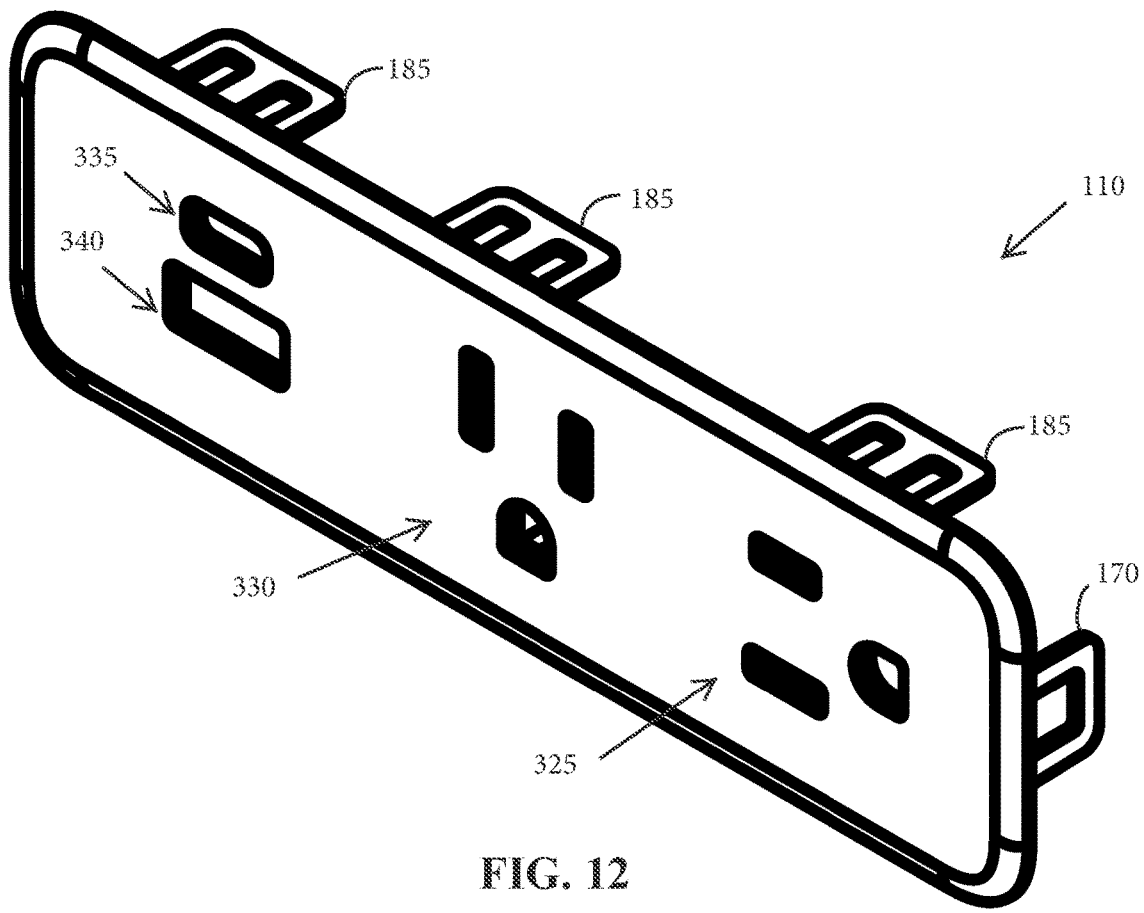
FIG. 12 is a front, top perspective view of an outer front face panel of the electrical power unit of FIG. 4.

Referring to FIG. 12, the outer front face panel 110 includes side latch tabs or snap-fit elements 170 that are configured to engage with corresponding side snap-fit elements 175 formed along outer side surfaces of the lower housing portion 120 (FIGS. 5-7, 18, and 19) and corresponding side snap-fit elements 180 formed along outer side surfaces of the upper housing portion 125 (FIGS. 8, 9, 20, and 21). The side snap-fit elements 170 of the outer front face panel 110 extend rearwardly from side edges of the outer front face panel 110, one of which is shown in FIG. 12. The side snap-fit elements 175, 180 are stubs protruding from the right and left sides of the respective lower and upper housing portions 120, 125. The lower housing portion's side snap-fit elements 175 lie adjacent the upper housing portion's side snap-fit elements 180 when the housing portions 120, 125 are assembled together, such that each of the outer front face panel's side latch-tabs 170 simultaneously engages two adjacent snap fit elements 175, 180. The side latch-tabs 170 can thus serve to provide a limited securing function that holds the housing portions 120, 125 together at their front edge regions, even if threaded fasteners have not been installed to more securely attach the housing portions 120, 125 together.

Figure 7:
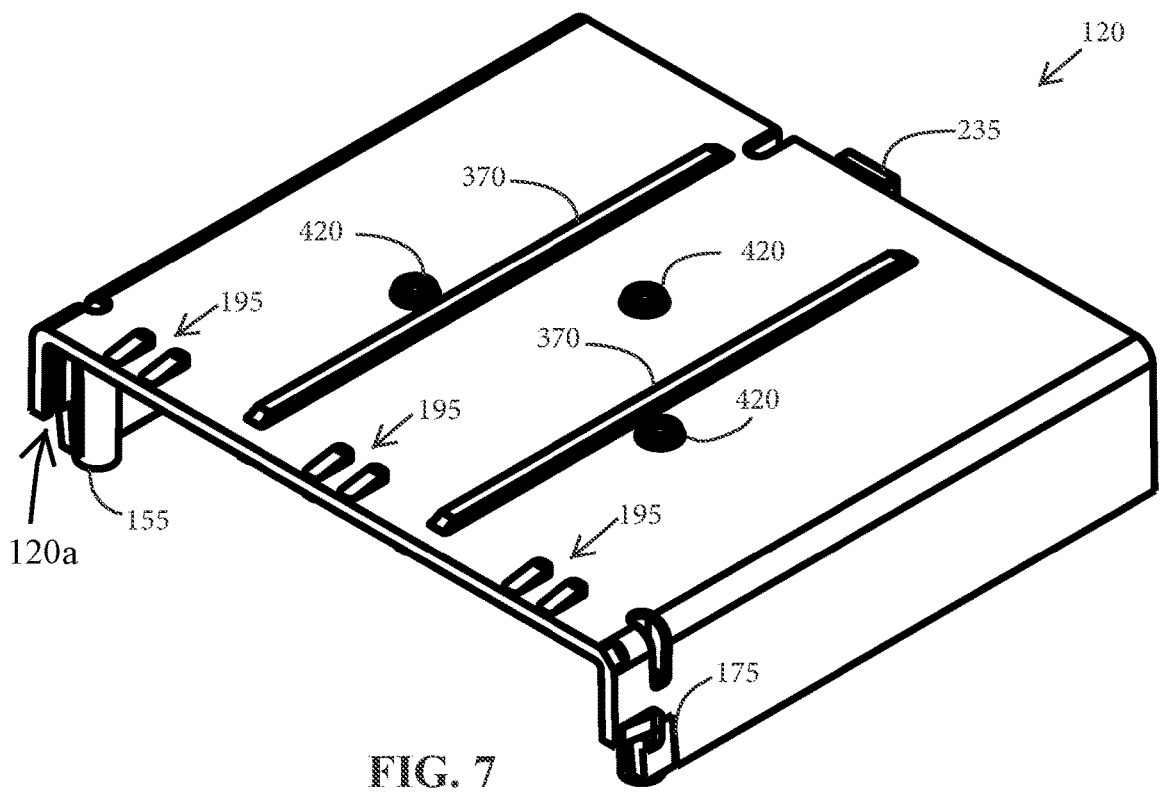
FIG. 7 is a front, bottom perspective view of the lower housing portion of the electrical power unit of FIG. 4.
Figure 8:
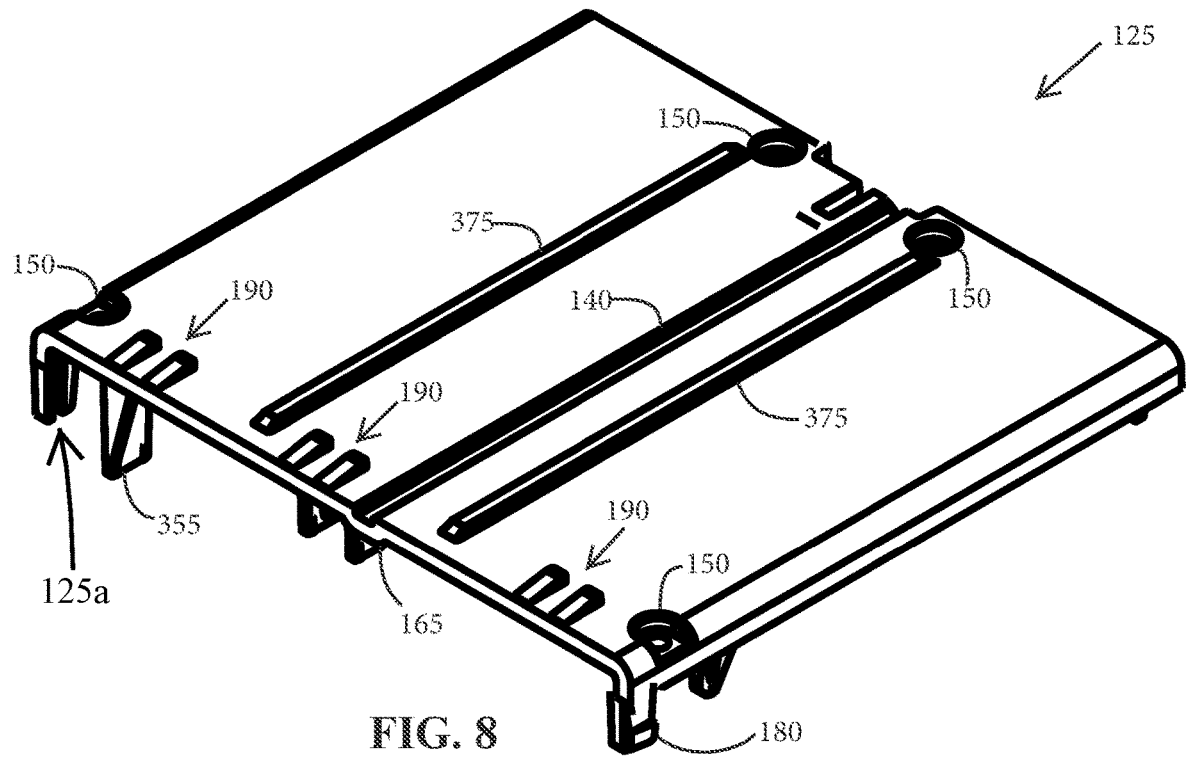
FIG. 8 is a front, top perspective view of the upper housing portion of the electrical power unit of FIG. 4.
Figure 19:
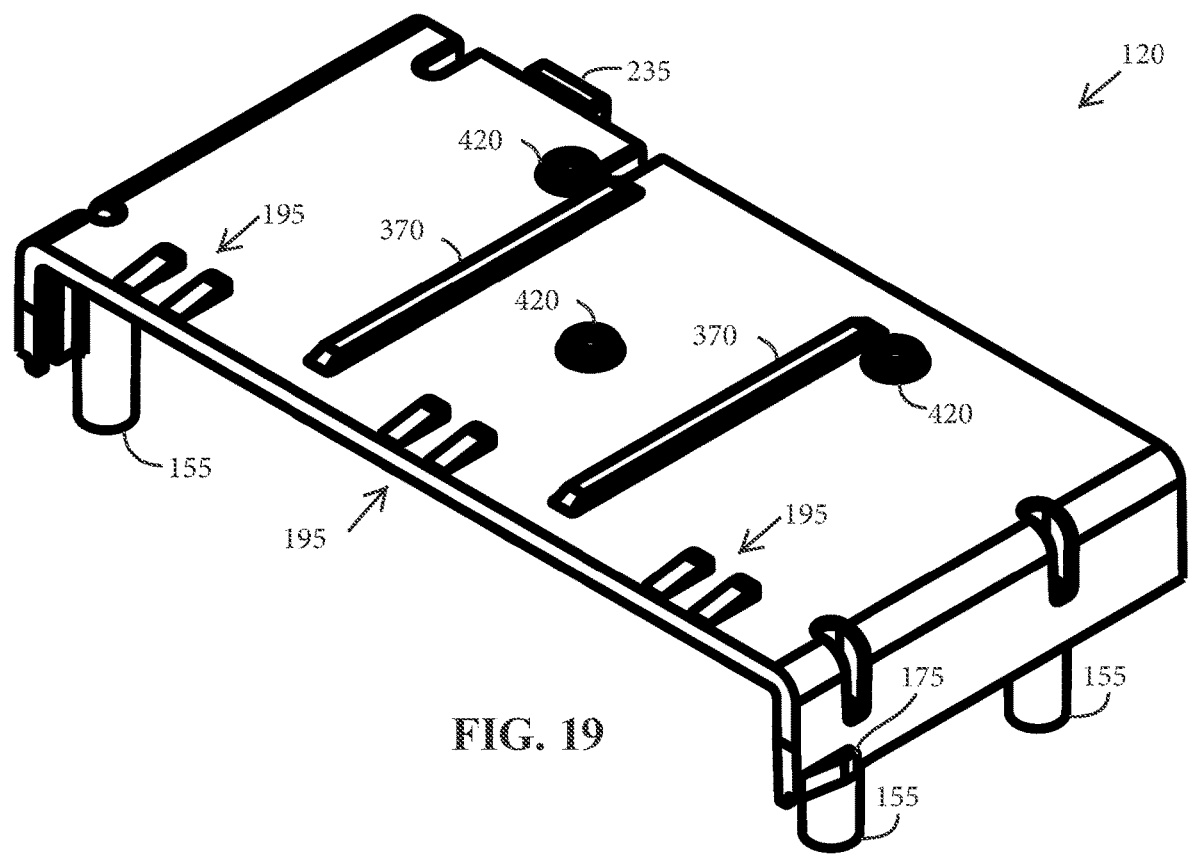
FIG. 19 is a front, bottom perspective view of the lower housing portion of FIG. 18.
Figure 20:
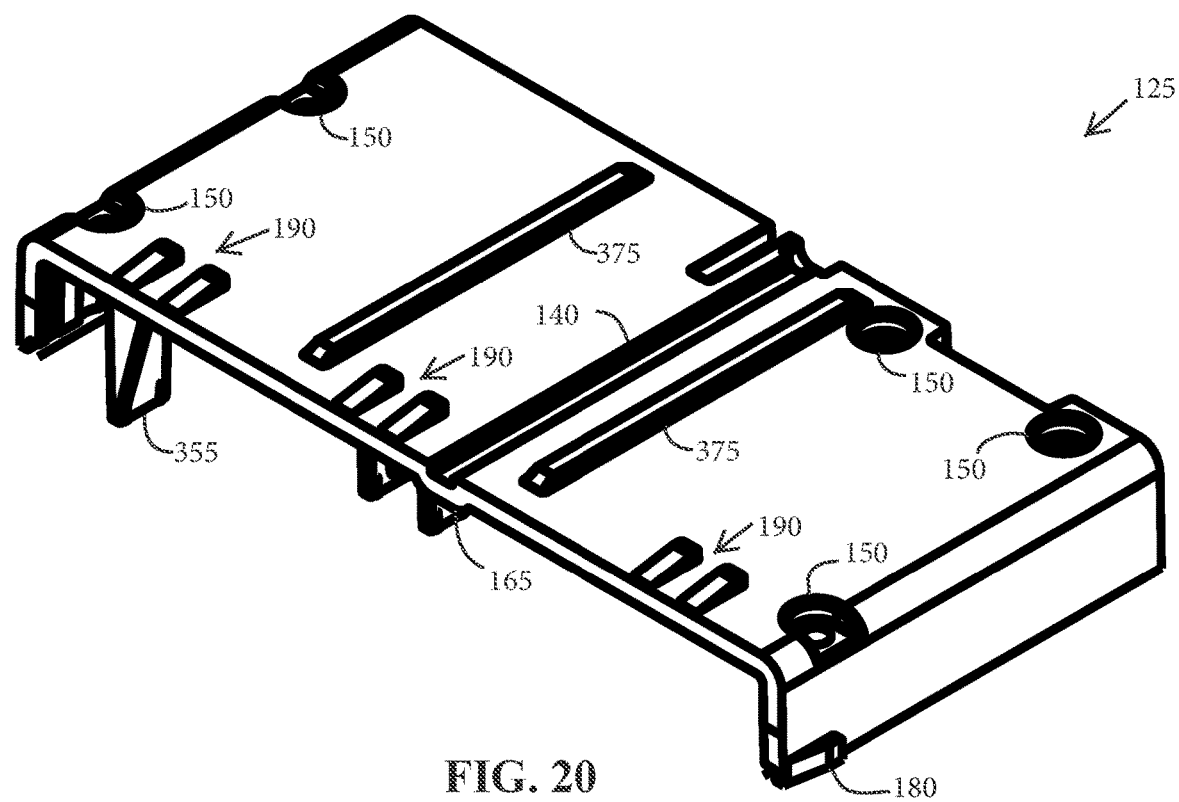
FIG. 20 is a front, top perspective view of another upper housing portion that is an alternative to the upper housing portion of FIG. 4.

The outer front face panel 110 includes top latch tabs or snap-fit elements 185 (FIG. 12) that engage with corresponding top snap-fit elements 190 formed in the upper housing portion 125 (FIGS. 8 and 20). The top snap-fit elements 185 of the outer front face panel 110 include three projections that extend rearwardly from the top edge of the outer front face panel 110 and cooperate to define two rectangular openings that receive corresponding pairs of top snap-fit elements 190. The top snap-fit elements 190 of the upper housing portion 125 are pairs of ramped projections protruding from the top of the upper housing portion 125, with the ramped surfaces beginning at the forward edge of the upper housing portion 125 and reaching their maximum height at their furthest distance from the forward edge of the upper housing portion 125. This allows the outer front face panel's top snap-fit elements 185 to easily slide over the upper housing portion's top snap-fit elements 195 until the elements 185 snap down over the elements 195, with two rectangular openings of elements 185 receiving the ramp-like elements 195. The outer front face panel 110 includes lower snap-fit elements (not shown in FIG. 12) that correspond to the upper snap-fit elements 185, and are configured to engage with corresponding lower snap-fit elements 195 formed by the lower housing portion 120 (FIGS. 7 and 19). The upper and lower snap-fit elements 185 may be release from the other snap-fit elements 190, 195 by initially lifting the elements 185 with a fingernail or a tool such as a flat-bladed screwdriver, and then pulling the outer front face panel 110 away from the inner front face panel 130 and the housing portions 120, 125. It will be appreciated that the various snap-fit elements and elongate guide elements may be arranged asymmetrically to provide visual cues as to the proper assembly, and to ensure the various components cannot be readily assembled in an improper manner.

Figure 9:
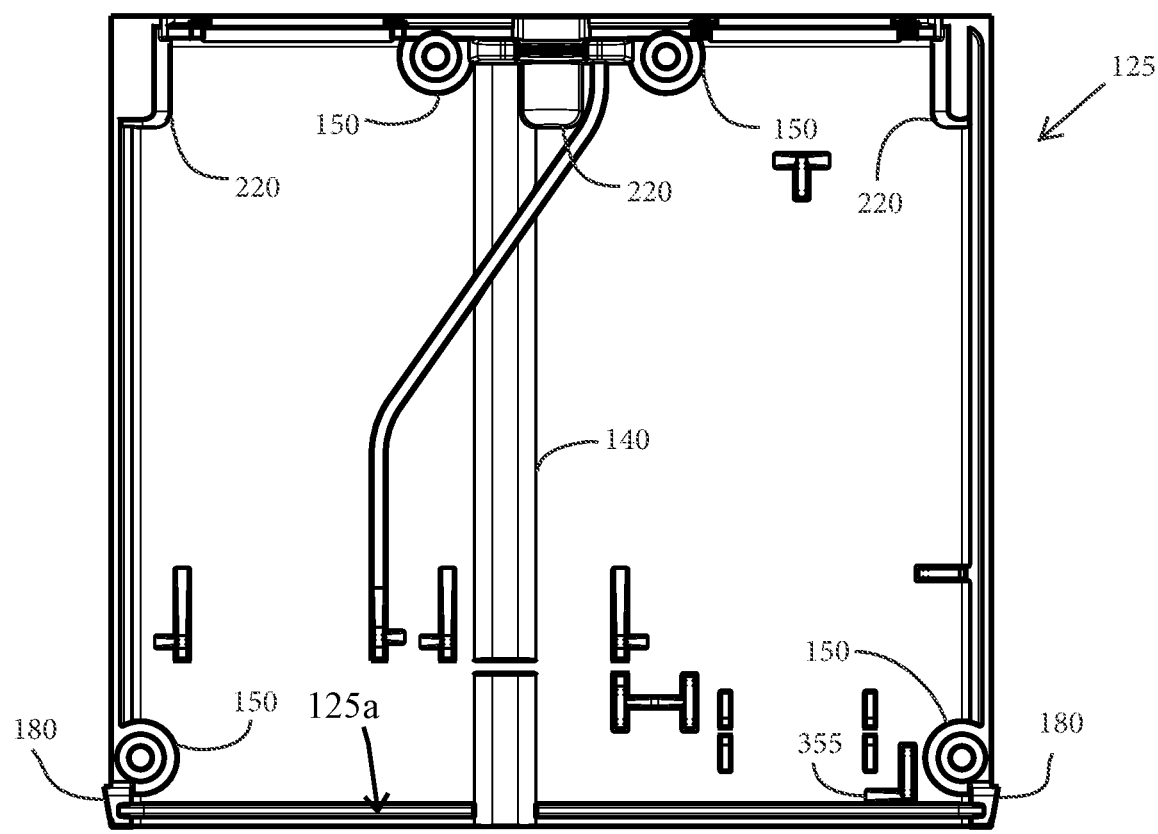
FIG. 9 is a bottom plan view of the upper housing portion of the electrical power unit of FIG. 4.
Figure 21:
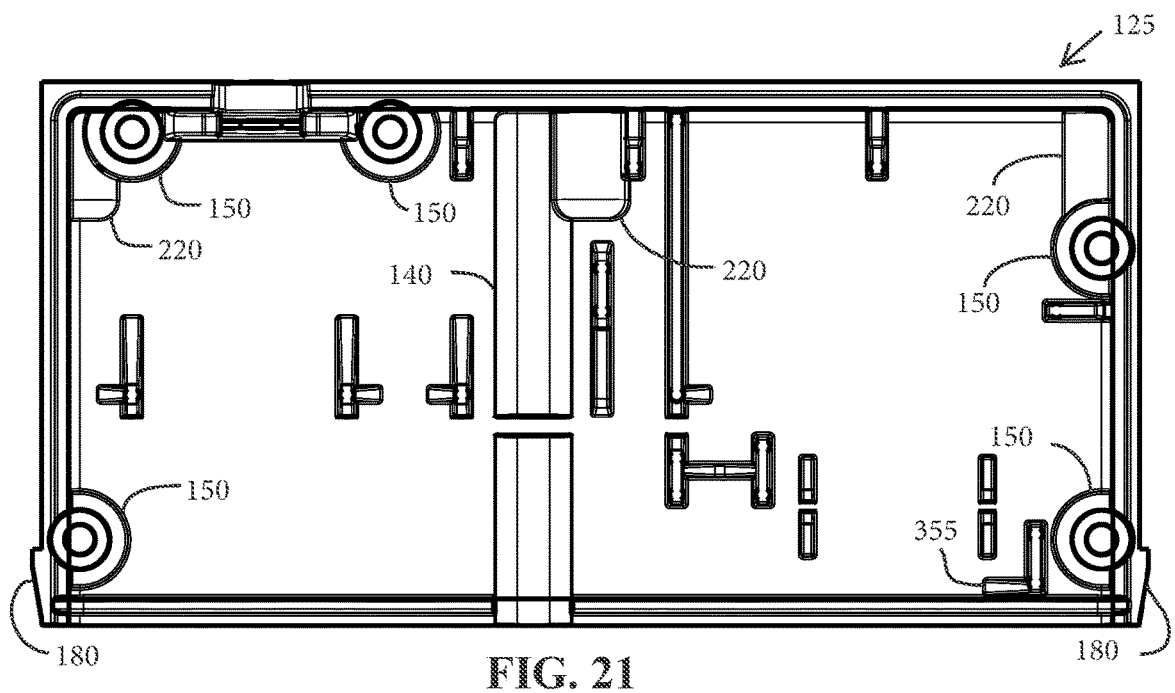
FIG. 21 is a bottom plan view of the upper housing portion of FIG. 20.
Figure 22:
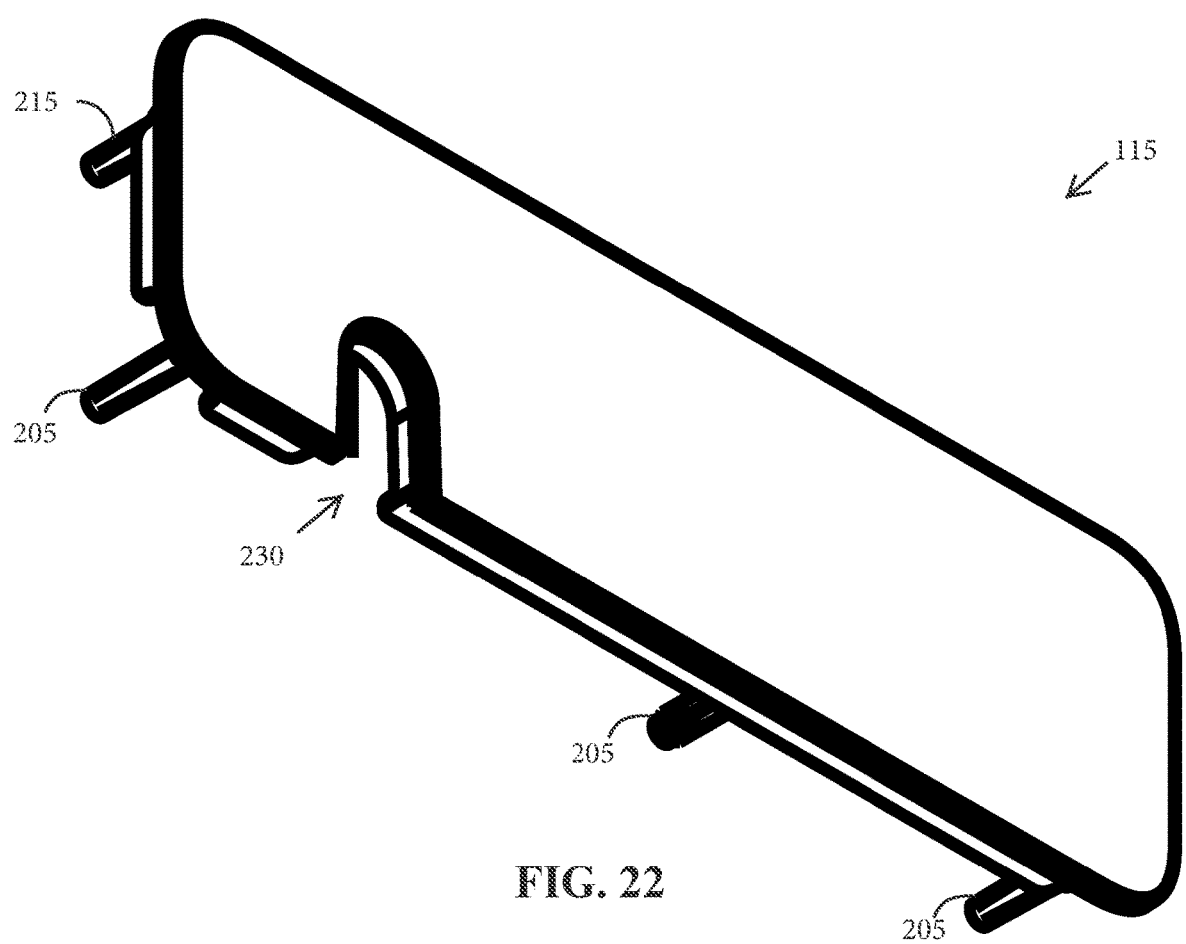
FIG. 22 is a rear, bottom perspective view of another rear face panel that is an alternative to the rear face panel of FIG. 4.

Referring to FIGS. 13, 14, 22, and 23, the rear face panel 115 includes lower attachment protrusions 205 that are press-fit posts for engaging respective lower rear-facing openings (i.e., blind holes) formed in partial-cylindrical bosses 210 of the lower housing portion 120 (FIGS. 5, 6, and 18), and open at a rear face of the lower housing portion 120. The lower attachment protrusions 205 are three press-fit posts that extend forwardly from the lower portion of the rear face panel 115 and are inserted into the rear-facing openings formed in the bosses 210. The rear face panel 115 further includes upper attachment protrusions 215 (FIGS. 13, 14, 22, and 23) that are press-fit posts for engaging respective upper rear-facing openings (i.e., blind holes) formed in partial-cylindrical bosses 220 of the upper housing portion 125 (FIGS. 9 and 21). The upper attachment protrusions 215 are three press-fit posts that extend forwardly from the upper portion of the rear face panel 115 and are inserted into the rear-facing openings formed in the bosses 220. The rear face panel 115 may be removed by initially using a fingernail or a tool such as a flat-bladed screwdriver to initially pry the face panel 115 away from the housing portions 120, 125 by overcoming the frictional holding force of press-fit posts 205, 215 in the respective bosses 210, 220. Alternatively, and as shown in FIG. 3, another rear face panel 115' may define openings 217 for threaded fasteners 219 to extend into the lower and upper housing portions 120, 125. It will be appreciated that any of the lower housing portion 120, the upper housing portion 125, the inner front face panel 115, the outer front face panel 110, and the rear face panel 115 may be secured utilizing any fastening elements and/or retaining elements in any other suitable fastening method such as, for example, rivets, ultrasonic welding, mechanical fasteners, snap-fit fasteners, cold-swaged connections, or the like.

Referring again to FIG. 4, electrical power unit 200 receives high voltage AC electrical power from an electrical cord 225 that enters through both an outer power cord opening 230 defined in the rear face panel 115 (FIGS. 3, 13, 14, 22, and 23) and an inner power cord opening 235 with integral strain relief features defined in the lower housing portion 120 (FIGS. 5-7, 18, and 19). The inner power cord opening 235 provides strain relief for the electrical cord 225 by clamping down onto the cord's outer jacket at multiple spaced-apart impingement points as the cord 225 passes through the inner power cord opening 235. In the illustrated embodiment, the electrical cord 225 includes conductors 240 terminated with output terminals 245a, 245b. The output terminals 245a, 245b include female blade terminals 245a for line and neutral conductors, and a male blade terminal 245b for a ground conductor, the terminals 245a, 245b configured for engagement with corresponding back terminals associated with high voltage AC receptacles 250, 255 of a front receptacle assembly 275, as can be more fully understood with reference to commonly-owned U.S. Pat. Nos. 10,965,049 and 11,251,562, both of which are hereby incorporated herein by reference in their entireties. By supplying high voltage AC power to terminals of the AC receptacles 250, 255 with conductors 240 and terminals 245a, 245b, electrical power can be provided to all receptacles 250, 255, 260, 265, 270 in the electrical power unit 200, including low voltage DC receptacles 260 that receive their power via power converter circuitry of the front receptacle assembly 275. Output terminals 245 may be covered by flexible plastic insulator covers 276 (FIG. 4).

Front receptacle assembly 275 includes first and second AC receptacles 250, 255 and a front DC receptacle 260 that face the front of the electrical power unit 200. A rear-facing DC receptacle assembly includes DC converter circuitry 290 and a DC receptacle 265, the DC receptacle 265 contained inside DC housing portions 280a, 280b. A similar arrangement is shown and more fully described in commonly-owned U.S. Pat. No. 9,312,673, which is hereby incorporated herein by reference in its entirety. A rear-facing high voltage AC receptacle 270 has its own supply wiring 285 that connects to terminals associated with AC receptacles 250, 255 of front receptacle assembly 275. The manner in which receptacles 250, 255, 260, 265, 270 receive power and power conversion is further described in both above-referenced and incorporated U.S. Pat. Nos. 10,965,049 and 11,251,562.

Referring now to FIGS. 1-4 and 12, the outer front face panel 110 defines outer receptacle openings 325, 330, 335, 340 that align with respective inner receptacle openings 305, 310, 315, 320 of the inner front face panel 130 (FIGS. 10 and 11) to provide access to the respective receptacles 250, 255, 260 (FIG. 4) for electrical or electronic prongs or plugs. Additionally, the rear face panel 115 defines rear openings 345, 350 (FIGS. 4, 13, and 14) to provide prongs or plugs access to, the rear-facing DC receptacle housing 280a and receptacle 265, and the rear-facing AC receptacle 270 (FIG. 4). The AC receptacle openings 305, 310, 325, 330, 350 provide AC power plugs (e.g., male-prong plugs) access to the respective AC receptacles 250, 255, 270, which in turn allows AC power plugs to receive high voltage AC electrical power from the respective AC receptacles 250, 255, 270. The DC receptacle openings 315, 320, 335, 340, 345 provide compatible DC power plugs (e.g., USB-A and USB-C or other plugs) access to the respective DC receptacles 260, 265 (e.g., dual-outlet USB-A and USB-C or other power receptacles), which in turn allows DC power plugs to receive low voltage DC electrical power from the respective DC receptacles 260, 265. The receptacles 250, 255, 260, 265, 270, the inner receptacle openings 305, 310, 315, 320, the outer receptacle openings 325, 330, 335, 340, and the rear openings 345, 350 may be oriented at any desired angle, such as in a manner that is further described and incorporated in above-reference and incorporated U.S. Pat. No. 10,965,049.

In the embodiments of FIGS. 8-11, 20, and 21, the upper housing portion 120 and the inner front face panel 125 have rearwardly-projecting wall-like supports to protect electrical contacts of the front receptacle assembly 275 during insertion or removal of plugs or prongs into the receptacles 250, 255, 260 (FIG. 4). The upper housing portion 120 includes a contact support 355 (FIGS. 8, 9, 20, and 21) that prevents the inner front face panel 130 (FIG. 4) and/or the outer front face panel 110 (FIG. 4) from flexing excessively when pressure is applied to the front face panels 110, 130 or when a plug or prong is inserted into the receptacles 250, 255, 260. The inner front face panel 130 includes continuous walls 360 (FIG. 11) that surround the inner receptacle openings 305, 310, 315, 320 (FIGS. 10 and 11) to strengthen the inner front face panel 130, which are more fully described in the above-referenced U.S. Pat. No. 11,251,562. Additionally, the inner front face panel 130 includes contact supports 365 (FIGS. 10 and 11) that provide support during insertion or removal of a plug or prong into the receptacles 250, 255, 260. The insertion of plugs or prongs into receptacles 250, 255, 260 are described in both above-referenced U.S. Pat. Nos. 11,251,562 and 10,965,049. Continuous walls 360 and contact supports 365 are described in above-referenced U.S. Pat. No. 11,251,562.

Referring to FIGS. 7, 8, 19, and 20, elongated ribs 370, 375 are formed in the respective upper and lower housing portions 120, 125 to support and maintain alignment of the outer cover 105 (FIGS. 1-4 and 15-17). Ribs 370, 375 may also help to frictionally retain the outer cover 105 at the housing portions 120, 125 and/or to maintain light tension in the outer cover 105. For outer covers 105 made of softer or fibrous materials, ribs 370, 375 can limit or prevent the inner surface of the cover 105 from catching or snagging on the rearward ends of the upper and lower snap-fit elements 185 during removal of the cover 105. The outer cover 105 may be a continuous loop of soft material (e.g., fleece, felt, woven or non-woven fabric, cork, rubber) that is secured or retained by the ribs 370, 375 applying tension to the outer cover 105. Alternatively, the outer cover 105 may be made of harder materials such as, for example, resinous plastic, wood, metal (such as extruded aluminum), or one of those harder materials coated or covered with a softer material.

Figure 17:
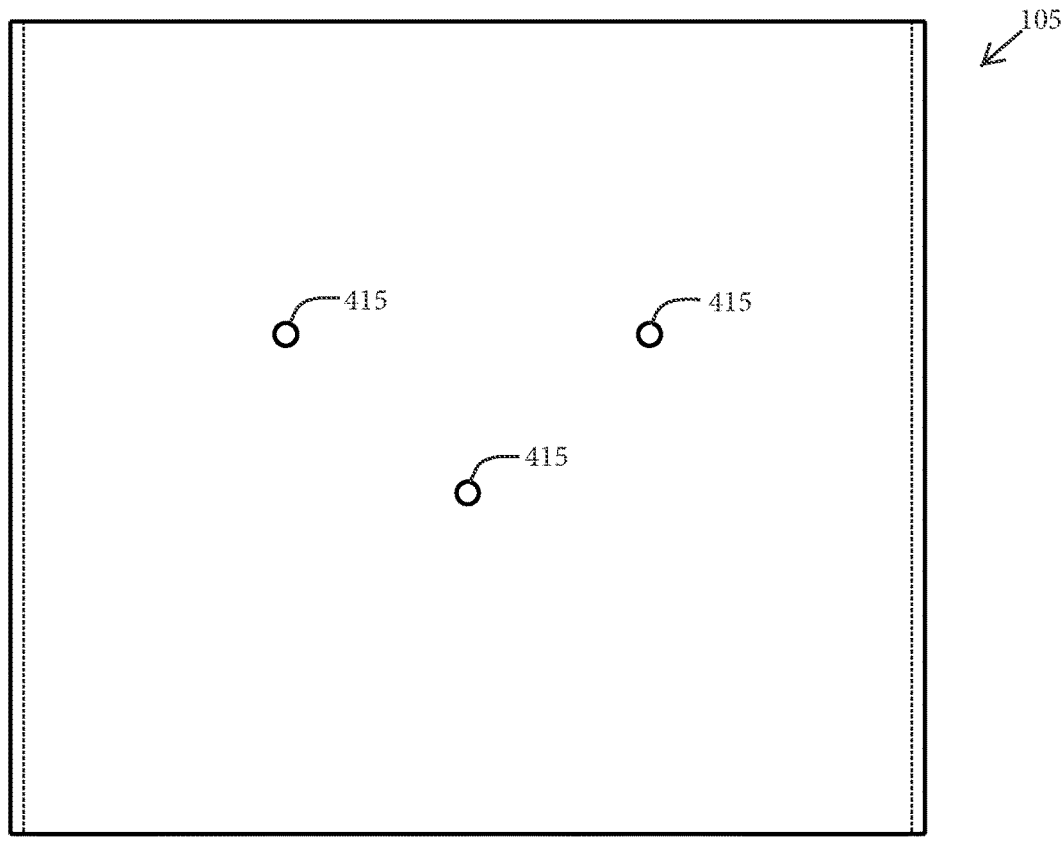
FIG. 17 is a bottom perspective view of the outer cover of the electrical power unit of FIG. 4.
Figure 18:
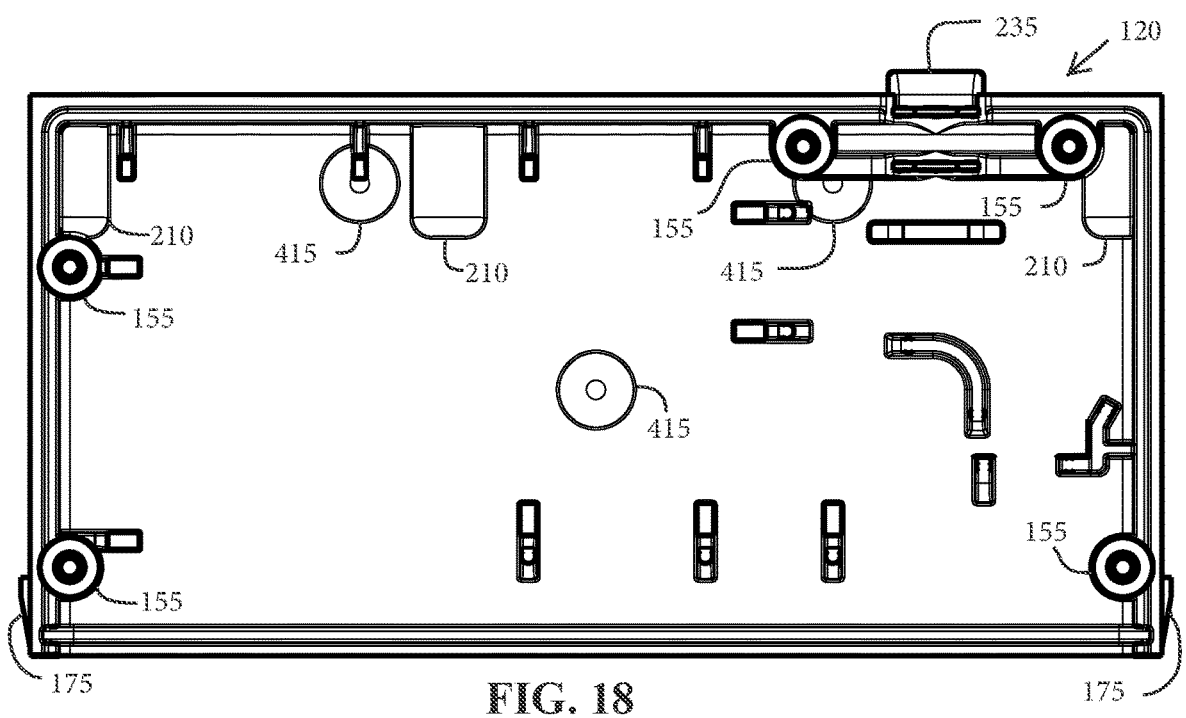
FIG. 18 is a top plan view of another lower housing portion that is an alternative to the lower housing portion of FIG. 4.

Mounting options for the electrical power units 100, 200 include an edge-mount clamp 400 or any other mounting arrangement such as those arrangements described in the above-referenced U.S. Pat. No. 10,965,049. The mount clamp 400 allows the electrical power unit 200 to be mounted in an elevated position above a work surface to which it is clamped, but in a manner that allows it to be released and moved around to other edge portions of a desk, table, countertop, shelf, or other work surface as desired by a user. The mount clamp 400 includes an upper platform 405 that defines openings 410 to support the electrical power units 100, 200, such as shown in FIG. 2. The openings 410 of the mount clamp 400 are aligned with openings defined in bosses 420 formed in the lower housing portion 120 (FIGS. 5-7, 18, and 19) and with corresponding openings 415 formed the outer cover 105 (FIG. 17). Threaded fasteners extend through the mount clamp's upper platform 405 at openings 410, then through the openings 415 of the outer cover 105, and then threadedly engage openings formed in the bosses 420 of the lower housing portion 120 to secure the mount clamp 400 to the lower housing portion 120. This also secures outer cover 105 against removal from housing portions 120, 125 as long as electrical power unit 100, 200 remains secured to mount clamp 400. Alternatively, the lower housing portion 120 may be secured to a mount by utilizing any fastening elements in any other suitable fastening method such as, for example, rivets, bolts, ultrasonic welding, snap-fit fasteners, cold-swaged connections, or the like.

Figure 24:
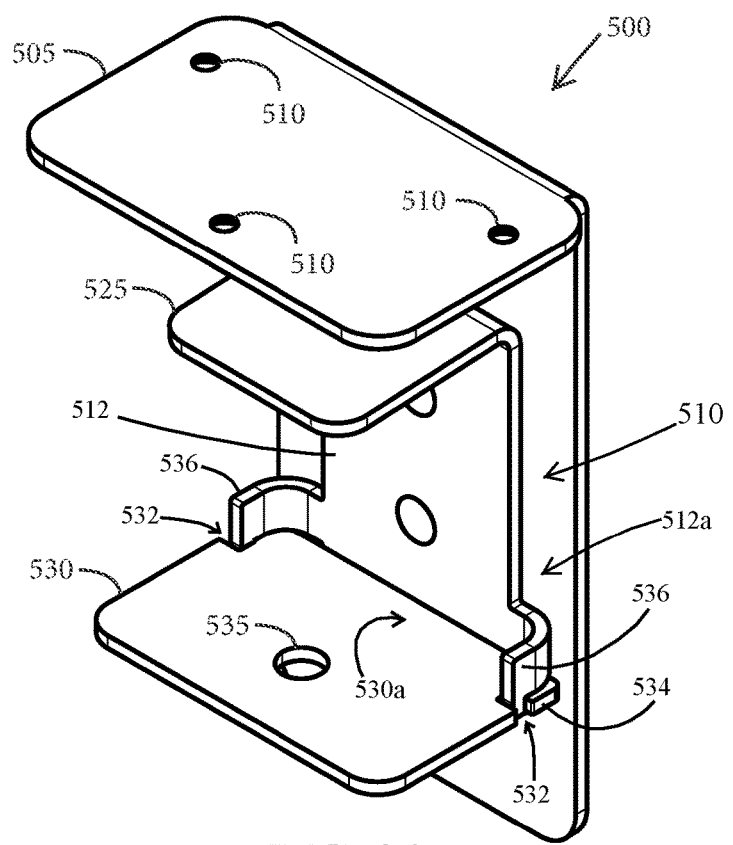
FIG. 24 is a front, top perspective view of a mount that is compatible for use with the electrical power units of FIGS. 1 and 4.
Figure 25:
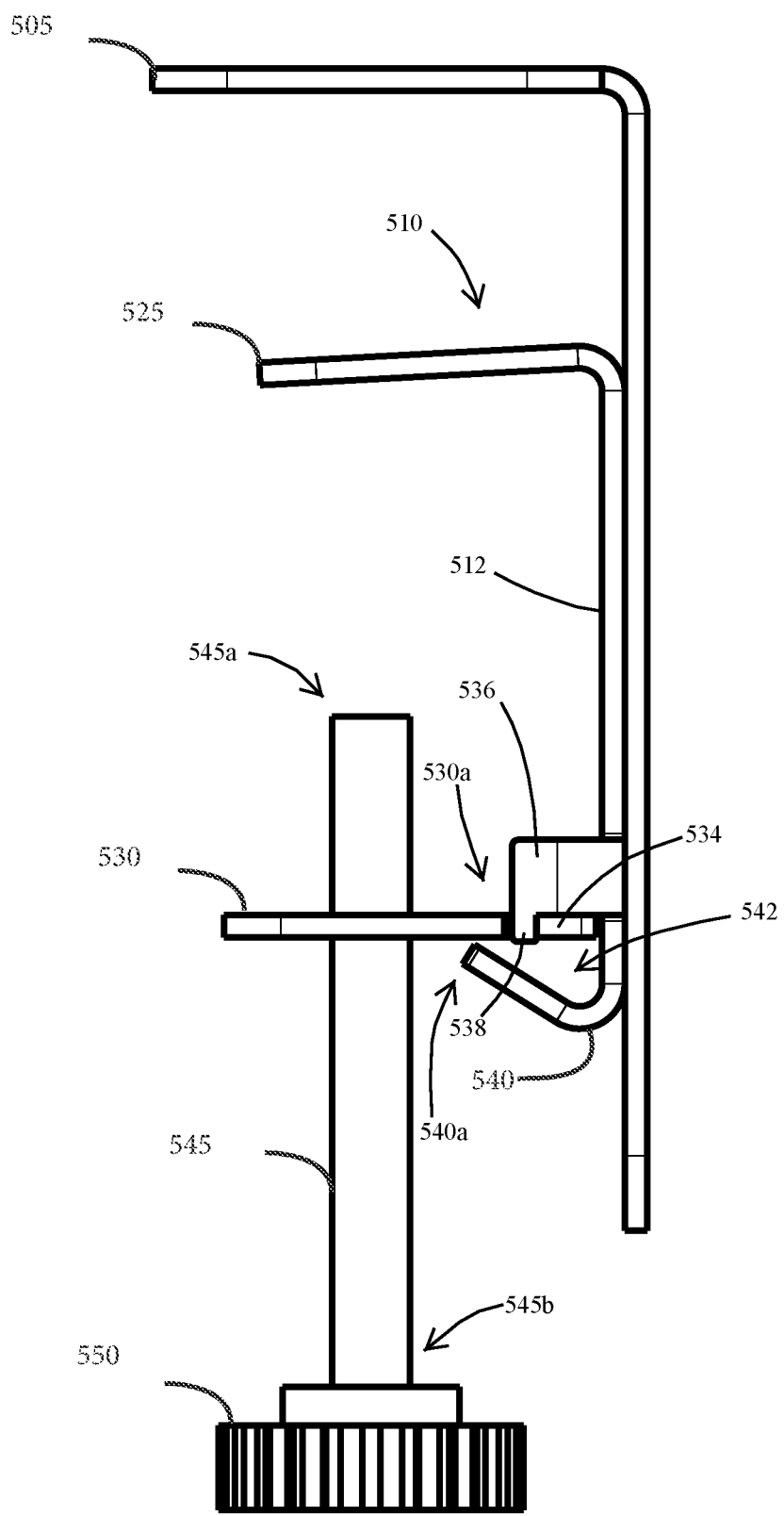
FIG. 25 is a side elevation view of the mount of FIG. 24, shown with a thumbscrew installed.

Referring to FIGS. 24 and 25, another edge-mount clamp 500 is similar to the above-described edge-mount clamp 400, and includes an upper platform 505 with openings 510 for receiving fasteners (not shown) that secure to the lower housing portion 120. Clamp 500 further includes an edge-mount coupling portion 510 with an upright leg 512, an upper tab 525 for positioning above a work surface, and a removable lower tab 530 for positioning below the work surface. As shown in FIG. 25, upper tab 525 is angled slightly downwardly as it extends forwardly away from upright leg 512, which allows upper tab 525 to rest flat atop a work surface while providing a spring clamping force to the top of the work surface when the clamp 500 is secured as described below. The removable lower tab 530 has a rear portion 530a that includes a pair of notches 532 along the sides thereof, leaving respective corner tabs 534 extending laterally at each rear corner of the lower tab 530.

A lower region of upright leg 512 has opposite sides including curved, forward-projecting arms 536, each with a downward-extending tab 538 that is received in the respective notch 532. Below the forward-projecting arms 536 of upright leg 512 is an upwardly-angled plate 540 that define an angled recess 542 and also a pair of gaps 544 between a forward portion 540*a* of the upwardly-angled plate 540 and the downward-extending tabs 538, such as shown in FIG. 25. This arrangement allows the lower tab 530 to initially have its rear portion 530*a* inserted at an angle (with a forward portion 530*b* elevated above rear portion 530*a*) through the gaps 544 and into the angled recess 542. The lower tab 530 is then leveled by lowering its forward portion 530*b*, which may cause the lower tab 530 to pivot atop the upwardly-angle plate's forward portion 540*a*, and raising the lower tab's rear portion 530*a* into engagement with the lower region of the upright leg 512. In this way, corner tabs 534 are urged upwardly into engagement with a lower surface of each forward-projecting arm 536, and notches 532 are urged upwardly into engagement with the respective downward-extending tabs 538. These engagements, combined with the lower tab 530 contacting forward portion 540*a* of the upwardly-angled plate 540, secures the lower tab 530 to upright leg 512 in such a way that lower tab 530 cannot be separated from the upright leg 512 unless the lower tab 530 is first pivoted by raising its forward portion 530*b* relative to its rear portion 530*a*.

When edge-mount coupling portion 510 is secured to a work surface, the work surface is received between lower tab 530 and upper tab 525, and lower tab 530 cannot be removed from upright leg 512 as long as the lower tab 530 is prevented from being pivoted by a distal tip 545*a* of a threaded shaft 545 contacting the bottom face of the work surface, or by the thickness of the work surface itself. The lower tab 530 defines a threaded opening 535 (FIG. 24) for the threaded shaft 545 (FIG. 25) to secure the edge-mount clamp 500 to the work surface. The threaded shaft 545 includes a knob 550 (FIG. 25) at its proximal end 545*b* to facilitate manual rotation of the shaft 545 to secure or release the edge-mount coupling portion 510 to the edge of the work surface or similar support structure.

Therefore, the electrical power unit facilitates changing aesthetic appearances while also obscuring most or all fasteners that are used to secure the underlying housing portions. The design of the electrical power unit allows users to easily insert, remove, and/or swap an outer cover, in some cases without need for tools, or with minimal use of a basic tool such as a flat-bladed screwdriver. The electrical power units may be bracket-mounted, or may be placed loosely on work surfaces, although adaptations may be made for other mounting styles, such as a grommet-mount. The electrical power units may also be customized to support different types of receptacles at front and/or rear panels, in some cases by changing only the receptacles and the front or rear panels.

Changes and modifications in the specifically described embodiments can be carried out without departing from the principles of the present invention which is intended to be limited only by the scope of the appended claims, as interpreted according to the principles of patent law including the doctrine of equivalents.

The invention claimed is:
1. An electrical power unit comprising:
a first housing portion;
a second housing portion coupled to the first housing portion to define front and rear openings and an interior between said first and second housing portions;
front and rear face panels coupled to said first and second housing portions at respective ones of said front and rear openings;
an elongate housing guide disposed along an exterior surface of one of said first and second housing portions;
an outer cover configured to be sleeved over said first and second housing portions and positioned between said front and rear face panels; and
an elongate outer cover guide disposed along an interior surface of said outer cover;
wherein said elongate outer cover guide is configured to slidingly engage said elongate housing guide as said outer cover is sleeved over said first and second housing portions.

2. The electrical power unit of claim 1, wherein said elongate housing guide comprises a channel and said elongate outer cover guide comprises a rib configured to be received in said channel.

3. The electrical power unit of claim 2, wherein at least one of said front and rear face panels defines a recess aligned with said elongate housing guide.

4. The electrical power unit of claim 1, wherein said front face panel comprises an inner front face panel, said electrical power unit further comprising an outer front face panel that covers said inner front face panel.

5. The electrical power unit of claim 4, wherein said outer front face panel has a height and a width that both exceed a corresponding height and width of said first and second housing portions coupled together.

6. The electrical power unit of claim 5, wherein said height and width of said outer front face panel are substantially equal to a corresponding height and width of said outer cover when said outer cover is sleeved over said first and second housing portions.

7. The electrical power unit of claim 5, wherein said outer front face panel comprises an outer periphery and a plurality of rearwardly-extending latch tabs positioned inboard of said outer periphery, wherein said latch tabs are configured to slidingly engage respective snap-fit elements arranged along outer surfaces of said first and second housing portions.

8. The electrical power unit of claim 7, wherein said rear face panel comprises a plurality of press-fit posts that frictionally engage respective holes formed in rear portions of said first and second housing portions.

9. The electrical power unit of claim 1, wherein said outer cover comprises extruded aluminum.

10. The electrical power unit of claim 1, wherein said outer cover comprises at least one of resinous plastic, rubber, felt, wood, and metal.

11. The electrical power unit of claim 1, wherein at least one of said first and second housing portions comprises an outwardly-extending rib configured to engage and support said outer cover.

12. The electrical power unit of claim 1, wherein said outer front face panel comprises an outer periphery and said first and second housing portions define respective forward channels, proximate said front opening, wherein said forward channels cooperate to receive respective portions of said outer periphery.

13. The electrical power unit of claim 1, further comprising an edge-mount clamp comprising a removable lower tab and a threaded shaft positioned in a threaded hole formed in said lower tab.

14. The electrical power unit of claim 13, wherein said edge-mount clamp comprises:
  a pair of spaced-apart forward-projecting arms; and
  an upwardly-angled plate spaced below said forward-projecting arms and defining an angled recess;
  wherein a rear portion of said lower tab is insertable into said angled recess and then pivotable about a forward portion of said upwardly-angled plate and into engagement with said forward-projecting arms.

15. The electrical power unit of claim 14, wherein said rear portion of said lower tab comprises a pair of notches and a corresponding pair of corner tabs, and said forward-projecting arms comprise respective downward-extending tabs that are received in said notches as said corner tabs engage lower surfaces of said forward-projecting arms.

16. The electrical power unit of claim 1, wherein said front face panel defines at least one forward opening providing access to a forward-facing electrical receptacle, and said rear face panel defines at least one rearward opening providing access to a rearward-facing electrical receptacle.

17. An electrical power unit comprising:
  a first housing portion coupled to a second housing portion, said first and second housing portions cooperating to define an interior for supporting a plurality of electrical receptacles, and front and rear openings to said interior;
  a rear face panel mounted at said rear opening;
  an inner front face panel having an outer periphery received in a channel defined by said first and second housing portions proximate said front opening;
  an outer front face panel having an outer periphery with a height and a width that exceed a respective height and width of said first housing portion coupled to said second housing portion;
  a plurality of rearwardly-extending latch tabs positioned inboard of said outer periphery, wherein said latch tabs are configured to slidingly engage respective snap-fit elements arranged along outer surfaces of said first and second housing portions to releasably secure said outer front face panel to said first and second housing portions; and
  an outer cover sleeved over said first and second housing portions and positioned between said outer front face panel and said rear face panel.

18. The electrical power unit of claim 17, wherein said first and second housing portions comprise respective snap-fit elements that lie adjacent one another when said first and second housing portions are coupled together, and wherein one of said latch tabs is configured to simultaneously engage said adjacent snap-fit elements.

19. The electrical power unit of claim 18, further comprising:
  an elongate outer cover guide disposed along an interior surface of said outer cover; and
  an elongate housing guide disposed along an exterior surface of one of said first and second housing portions;
  wherein said elongate outer cover guide is configured to slidingly engage said elongate housing guide as said outer cover is sleeved over said first and second housing portions.

20. The electrical power unit of claim 19, further comprising:
  a forward-facing electrical receptacle mounted in said interior; and
  a rearward-facing electrical receptacle mounted in said interior;
  wherein said inner and outer front face panels each define a forward opening providing access to said forward-facing electrical receptacle, and said rear face panel defines a rearward opening providing access to said rearward-facing electrical receptacle.

* * * * *